(12) United States Patent
Yoshiike

(10) Patent No.: US 7,474,007 B2
(45) Date of Patent: Jan. 6, 2009

(54) SEMICONDUCTOR PACKAGE

(75) Inventor: Kazuaki Yoshiike, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/492,220

(22) Filed: Jul. 25, 2006

(65) Prior Publication Data
US 2007/0102825 A1 May 10, 2007

(30) Foreign Application Priority Data
Jul. 25, 2005 (JP) ............................. 2005-213948

(51) Int. Cl.
*H01L 23/48* (2006.01)
*H01L 23/52* (2006.01)
*H01L 29/40* (2006.01)

(52) U.S. Cl. ........................................ 257/784; 257/668
(58) Field of Classification Search ................. 257/668, 257/784, 781, 776, 773
See application file for complete search history.

(56) References Cited

U.S. PATENT DOCUMENTS

| | | | | |
|---|---|---|---|---|
| 6,228,683 B1 * | 5/2001 | Manteghi | ................... | 438/112 |
| 6,239,384 B1 * | 5/2001 | Smith et al. | .................. | 174/261 |
| 6,407,508 B1 * | 6/2002 | Kawada et al. | ........... | 315/169.3 |
| 6,509,643 B2 * | 1/2003 | Ohtaka et al. | ............... | 257/712 |
| 6,525,414 B2 * | 2/2003 | Shiraishi et al. | ............. | 257/686 |
| 6,664,618 B2 | 12/2003 | Takahashi et al. | | |
| 6,734,535 B1 * | 5/2004 | Hashimoto | ................... | 257/668 |
| 2006/0157830 A1 * | 7/2006 | Hoag | ......................... | 257/668 |

\* cited by examiner

*Primary Examiner*—S. V Clark
(74) *Attorney, Agent, or Firm*—Rabin & Berdo, PC

(57) ABSTRACT

A semiconductor package of this invention achieves higher wiring densities and increases the degree of freedom of the wiring design. The semiconductor package includes a first substrate having first and second faces, and first wiring provided on the first face of the first substrate. The semiconductor package also includes a second substrate having first and second faces, and second wiring provided on the first face of the second substrate. The semiconductor package also includes a semiconductor chip connected to the first and second wiring. The first face of the first substrate faces the first face of the second substrate, and the first and second wiring intersect one another in three dimensions in an isolated state.

14 Claims, 32 Drawing Sheets

SEMICONDUCTOR PACKAGE

BACKGROUND OF THE INVENTION

1. Field of the Invention

The present invention relates to a semiconductor package and a method of fabricating same and, more particularly, to a TCP (tape carrier package) structure and a method of fabricating same.

2. Description of the Related Art

As the density of ICs increases, there is also a tendency for the number of wires in the semiconductor package to increase. Accordingly, there is a great demand for thinner and smaller semiconductor packages. Currently, the TAB (tape automated bonding) structure, which allows a semiconductor package to be made thinner than a flat package, is being developed and used in order to attempt the increased IC density on the substrate. A TAB-created package is known as a TCP, and permits high-density surface mounting. The TAB structure is adopted in an LCD (Liquid Crystal Display), for example.

However, there are limits in establishing high-density metal wiring even when the TCP is employed.

Single-layer wiring structures are also faced by wiring design (I/O terminal design) restrictions.

SUMMARY OF THE INVENTION

One object of the present invention is to provide a semiconductor package that achieves higher wiring densities and increases the degree of freedom of the wiring design.

According to a first aspect of the present invention, there is provided a semiconductor package that includes a first substrate having first and second faces. The semiconductor package also includes first wiring provided on the first face of the first substrate. The semiconductor package also includes a second substrate having first and second faces. The semiconductor package also includes second wiring provided on the first face of the second substrate. The semiconductor package also includes a semiconductor chip coupled to the first and second wiring. The first face of the first substrate faces the first face of the second substrate. The first and second wiring intersect each other three-dimensionally in an isolated (insulated) state.

Sheet-like substrates made of an insulating material, for example, can be used for the first and second substrates. The first and second wiring can be molded with a metallic electrically conductive material, for example. An insulating material may be placed between the first and second wiring in order to isolate (insulate) the first wiring from the second wiring. Alternatively, spacing can be used to insulate the first and second wires from each other.

Preferably, both or either one of the first wiring and second wiring has recesses in the position(s) of intersection(s) between the first and second wiring. Preferably, at least one of the first and second wiring is bent in an S-shape or Z-shape and the bent portion of the first or second wiring intersects the other wiring.

Preferably, the first substrate is a TCP (tape carrier package) tape carrier and the second substrate is a COF (chip-on-film) film carrier. In this case, the first and second wires are inner leads.

According to a second aspect of the present invention, there is provided a method of fabricating a semiconductor package. The fabrication method includes forming a plurality of first inner leads on a first face of a TCP tape carrier. The fabrication method also includes connecting a semiconductor chip to the first inner leads. The fabrication method also includes forming at least one second inner lead on a first face of a COF film carrier. The fabrication method also includes overlapping the tape carrier and the film carrier such that the first face of the tape carrier faces the first face of the film carrier and such that the first and second inner leads intersect each other three-dimensionally in an isolated (insulated) state.

The semiconductor package fabrication method of this invention may further include forming recesses in at least the first or second inner leads in positions of intersections with the other inner leads.

Preferably, a recess is formed in each of the first inner leads in a position of intersection with the corresponding second inner lead, and the tape carrier and the film carrier overlap such that the first and second inner leads intersect one another on a one-to-one basis.

Preferably, recesses are formed in the first inner leads in positions of intersections with one of the second inner leads, and the tape carrier and the film carrier overlap such that this second inner lead intersects more than one first inner lead.

The semiconductor package fabrication method may further include bending at least the first or second inner leads in an S-shape or a Z-shape. Preferably, the bent portions of the first or second inner leads intersect the other inner leads.

Preferably, a recess is formed in each of the first inner leads in positions of intersections with the second inner lead, the second inner lead has an X-shaped portion, and the tape carrier and the film carrier overlap such that the X-shaped portion of the second inner lead faces the recesses of the first inner leads.

Preferably, a recess is formed in each of the first inner leads and each of the second inner leads in a position of intersection, and the tape carrier and the film carrier overlap such that the recesses face one another.

DETAILED DESCRIPTION OF THE INVENTION

Embodiments of the present invention will be described hereinbelow. In the embodiments, three-dimensional wiring is implemented by a new package structure that combines a TCP and a COF.

First Embodiment

Referring to FIGS. 1, 2, 3, 4A and 4B, a COF film carrier 10 used for the semiconductor package according to the first embodiment of the present invention will be described.

Figure 1:
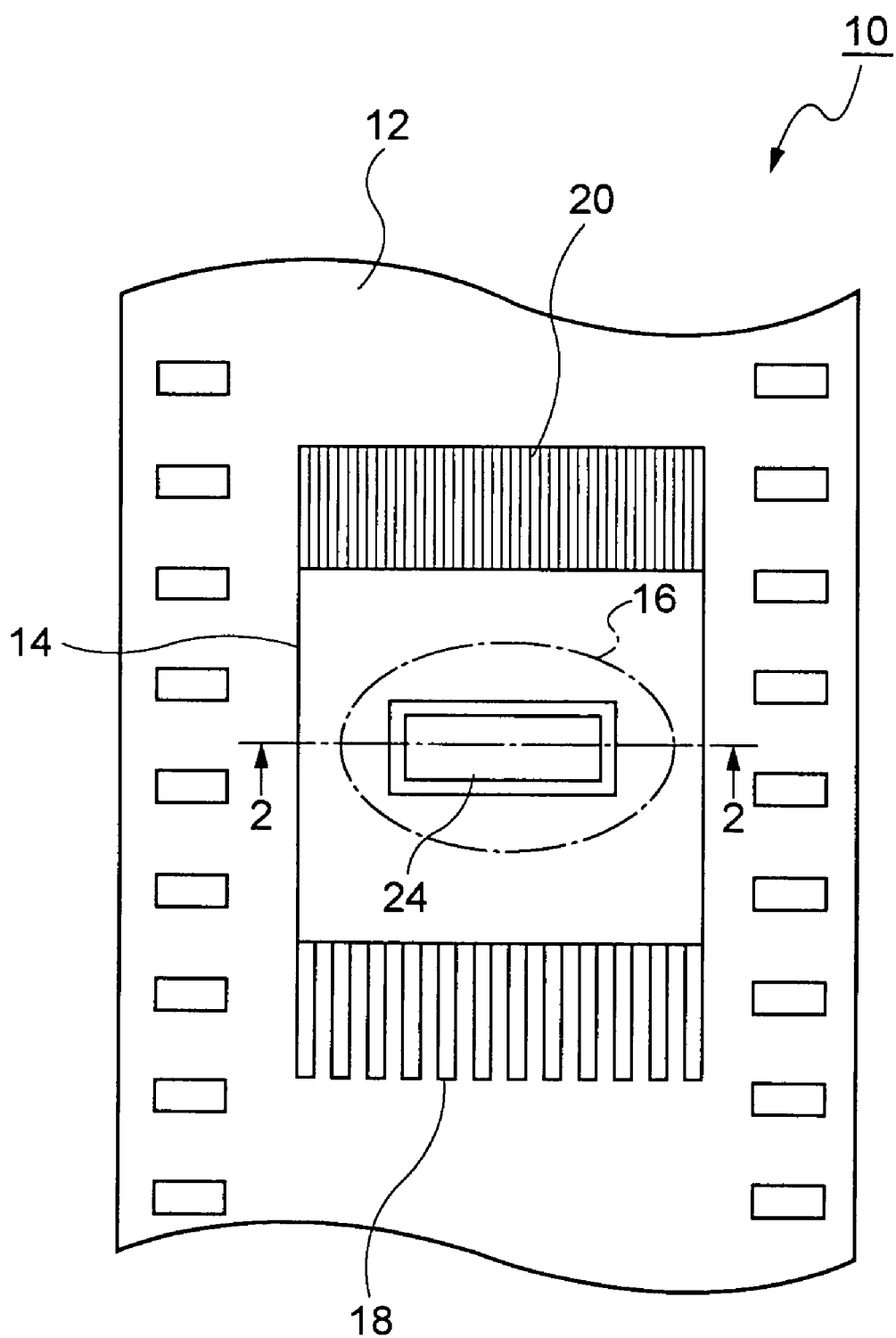
FIG. 1 is a plan view of a COF film carrier used for a semiconductor package according to a first embodiment of the present invention.

As shown in FIG. 1, the COF film carrier 10 has an input terminal 18 and an output terminal 20 that include metal wiring material formed on a substrate (film) 12. The substrate 12 has a thickness of about 38 μm. An open portion 24 for mounting the semiconductor chip 60 (FIG. 9) is formed on the substrate film 12. Areas of the metal wiring material other than those areas for the input terminal 18, output terminal 20, and inner lead 26 (FIG. 2) are protected by a resist 14. The overall constitution (except the structure of the inner lead) of the COF film carrier shown in FIG. 1 is also applied in the same way to the second to fourth embodiments which will be described later.

Figure 2:
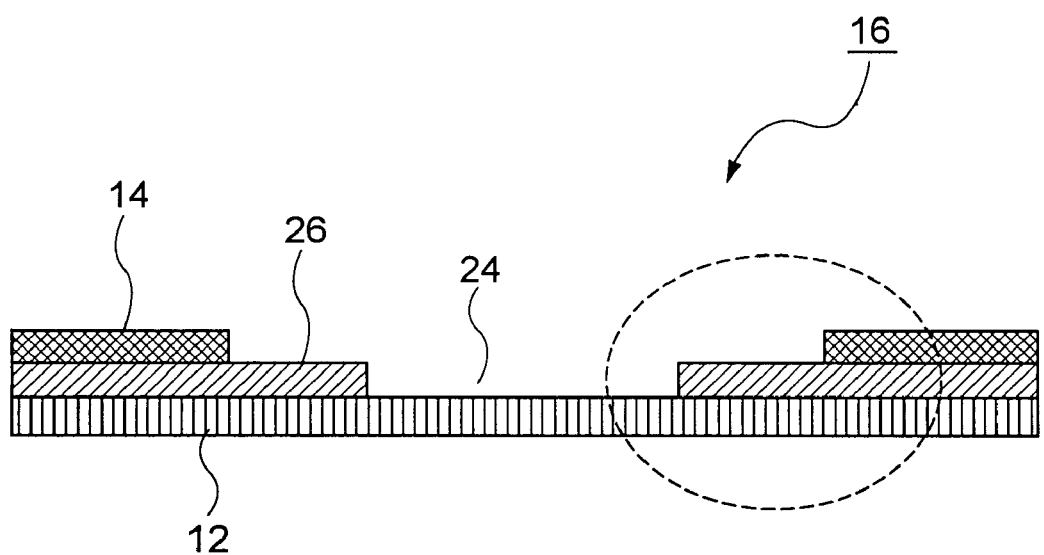
FIG. 2 is a cross-sectional view taken along the line 2-2 in FIG. 1.

FIG. 2 shows an area 16 surrounded by an ellipse indicated by the broken line in FIG. 1. Metal wiring 18, 20, 26 (FIG. 1) is directly formed on the substrate 12 by casting and plating, for example. The thickness of the metal wiring 18, 20, 26 is about 8 μm and the thickness of the resist 14 is about 25 μm.

Figure 3:
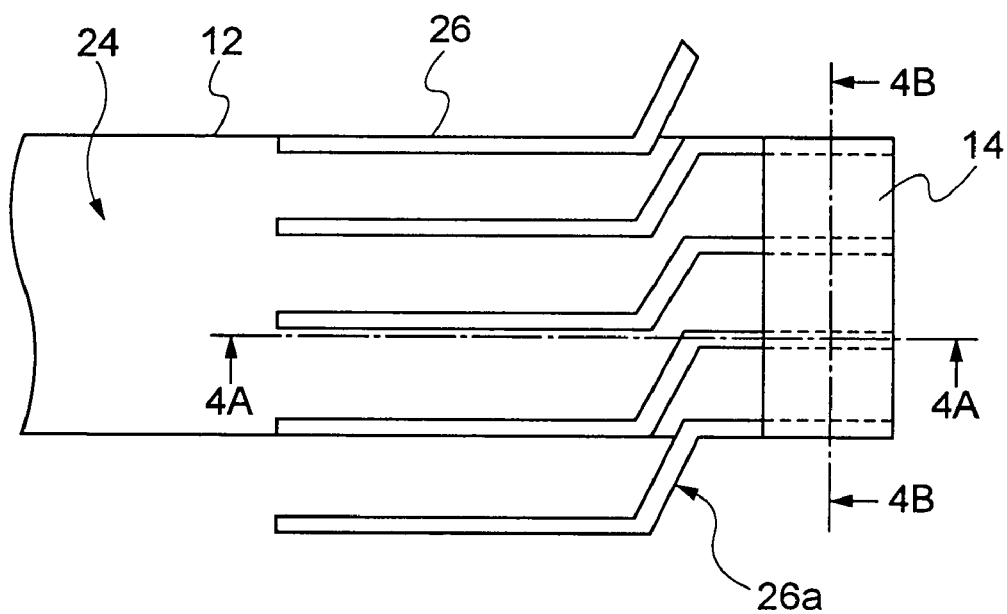
FIG. 3 is an enlarged plan view of part of FIG. 2 (the area surrounded by a broken-line ellipse)
Figure 4A:
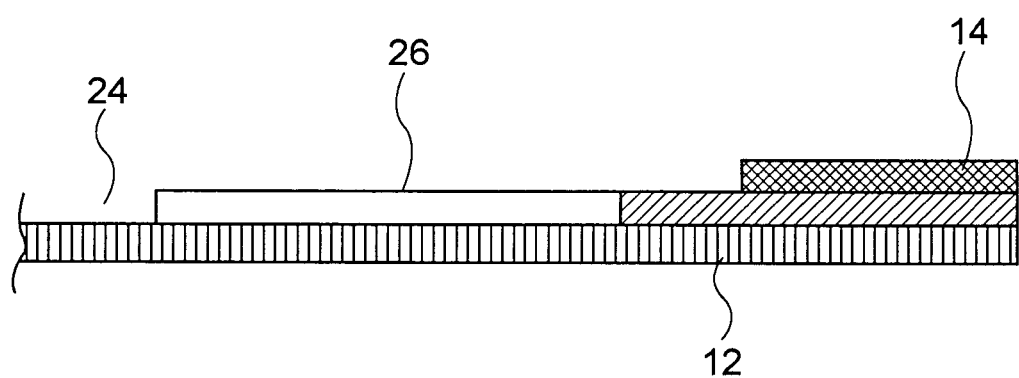
FIG. 4A is a cross-sectional view taken along the line 4A-4A in FIG. 3.
Figure 4B:
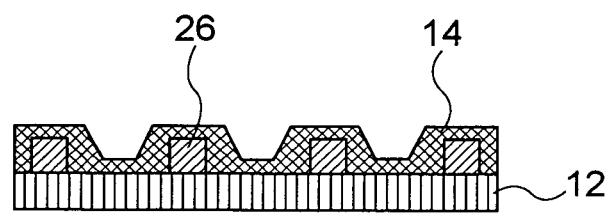
FIG. 4B is a cross-sectional view taken along the line 4B-4B in FIG. 3.

As shown in FIG. 3, the inner lead 26 is molded in an S-shape or stepped shape with a shape having a linear portion that extends linearly toward the open portion 24 and a bent portion (oblique portion) 26a. It should be noted that the shape of the inner lead 26 may be another shape such as a Z shape. The bent portion 26a of the inner lead 26 can be molded by general patterning. A wiring pattern of the inner lead 26 with the bent portion 26a is prepared beforehand and the pattern is used to form the inner lead 26 on the substrate 12. Such a method is an example and is also applicable to the second to fourth embodiments.

Figure 5:
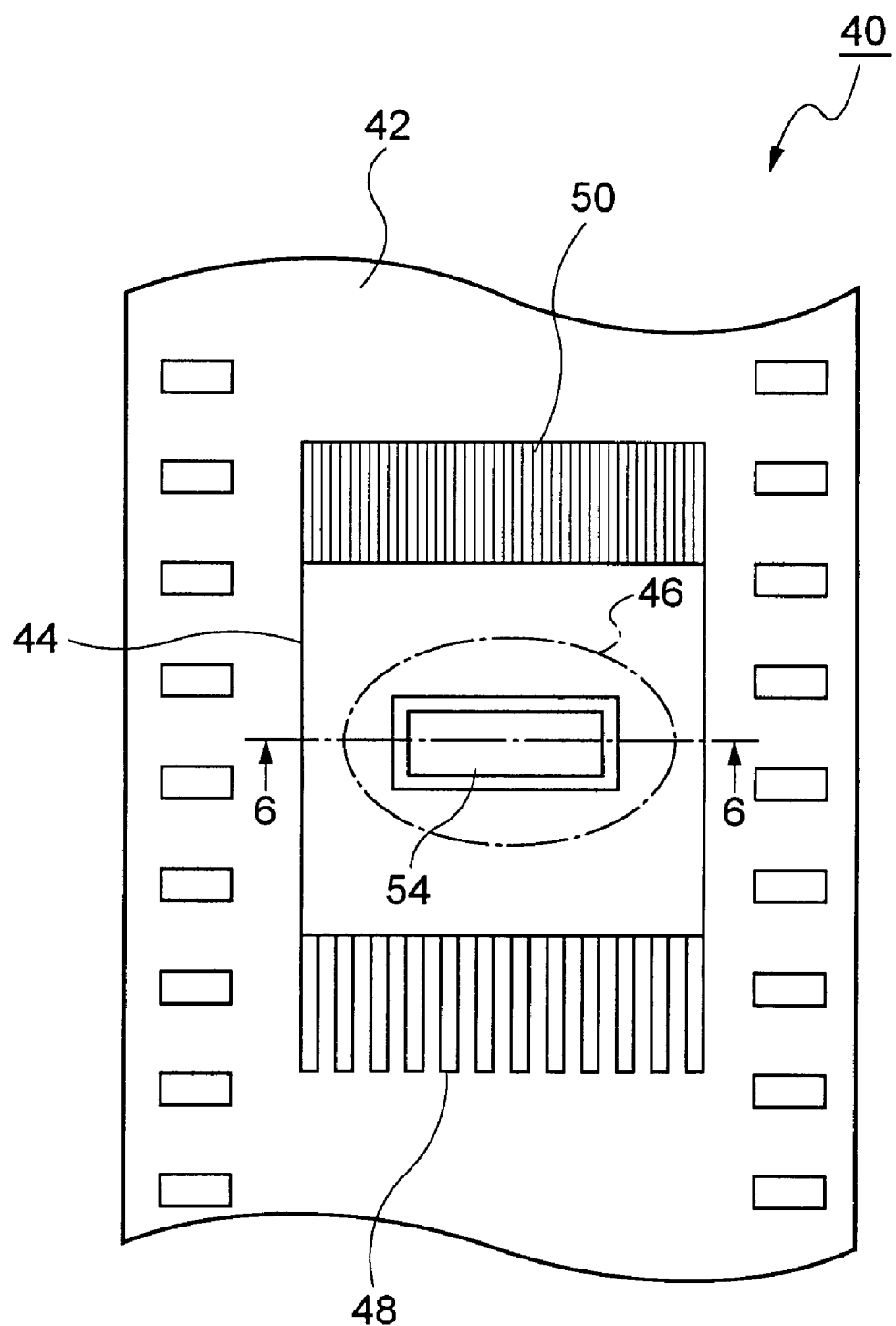
FIG. 5 is a plan view of the TCP tape carrier used for the semiconductor package according to the first embodiment.
Figure 6:
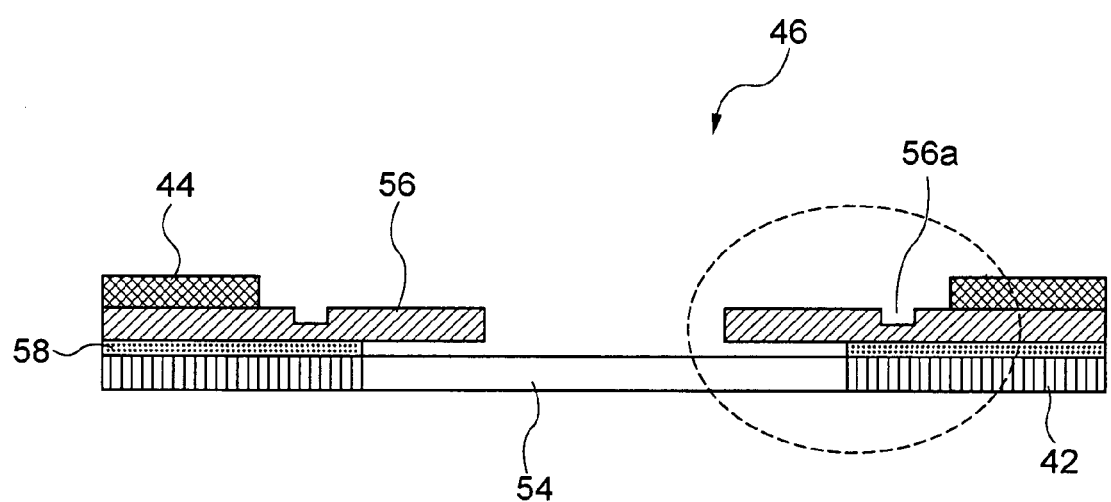
FIG. 6 is a cross-sectional view taken along the line 6-6 in FIG. 5.
Figure 7:
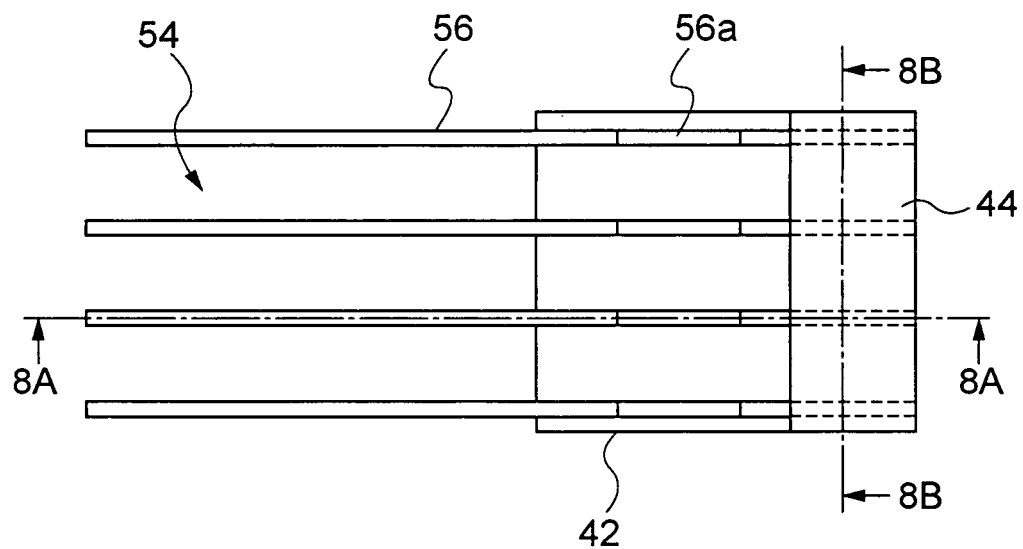
FIG. 7 is an enlarged plan view of a portion of FIG. 6 (area surrounded by a broken-line ellipse)
Figure 8A:
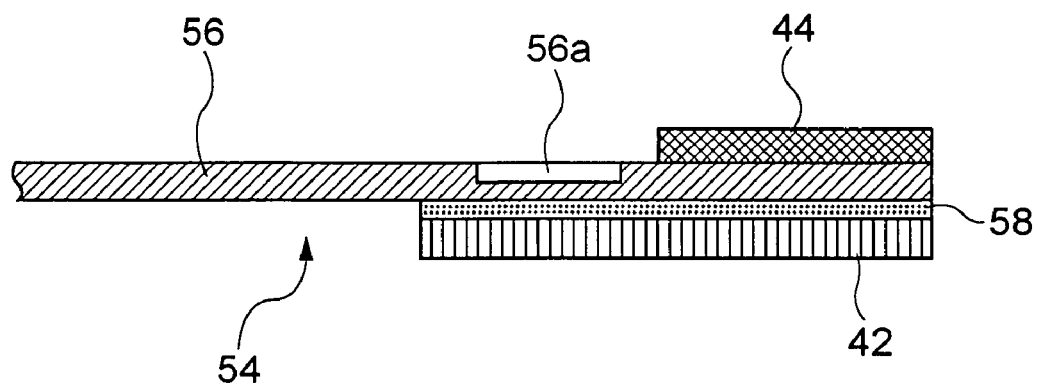
FIG. 8A is a cross-sectional view taken along the line 8A-8A in FIG. 7.
Figure 8B:
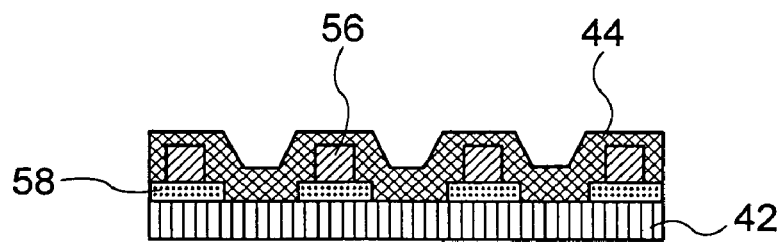
FIG. 8B is a cross-sectional view taken along the line 8B-8B in FIG. 7.

FIG. 5 is a plan view of a TCP tape carrier 40 used for the semiconductor package according to the first embodiment. FIG. 6 is a cross-sectional view taken along the line 6-6 in FIG. 5. FIG. 7 is an enlarged plan view showing part of FIG. 6 (area surrounded by the ellipse defined by the broken line). FIG. 8A is a cross-sectional view taken along the line 8A-8A in FIG. 7 and FIG. 8B is a cross-sectional view taken along the line 8B-8B in FIG. 7. As shown in FIG. 5, the TCP tape carrier 40 has an input terminal 48 and an output terminal 50 on a substrate (tape) 42. The input and output terminals 48 and 50 are made from a metal wiring material. The substrate 42 has a thickness of about 75 μm. An open portion 54 for mounting the semiconductor chip 60 (FIG. 9) is formed on the substrate 42. The metal wiring material other than those areas for the input terminal 48, output terminal 50, and inner lead 56 is protected by a resist 44. The overall constitution of the TCP tape carrier shown in FIG. 5 is also applied in the same way to the second to fourth embodiments. FIG. 6 shows an area 46 surrounded by an ellipse formed by the broken line in FIG. 5. Metal wiring 48, 50, 56 is bonded to the substrate 42 by adhesive 58. The thickness of the metal wiring 48, 50, 56 is about 15 μm, the thickness of the resist 44 is about 25 μm, and the thickness of the adhesive 58 is about 12 μm.

As shown in FIGS. 6, 7, 8A and 8B, a recess 56a is formed in each of the inner leads 56. The inner leads 56 extend linearly to the open portion 54. The positions of the recesses 56a correspond with (or intersect) the bent portions 26a of the inner leads 26 of the COF film carrier 10 in the subsequent assembly step. The recesses 56a are preferably located above the substrate 42. If the recesses 56a are formed in a position of protrusion from the substrate 42 (i.e., if the recesses are outside the substrate when viewed from the top), there is the risk that the positions of the intersections between the inner leads 26 and the recesses 56a in the perpendicular direction (vertical direction in FIG. 6) will become unstable.

When molding the recesses 56a in the inner leads 56, one of three methods may be used. A first method involves creating a die corresponding with the recesses 56a and molding the recesses 56a in the inner leads 56 by means of pressing. A second method involves molding a pattern that includes the inner leads 56 when creating the pattern of the TCP tape carrier 40. Then, the recesses 56a are formed by removing only the mask of the areas corresponding with the recesses 56a and etching these areas. A third method involves preparing two pieces (sheets) of metal wire material and forming a metal wire by patterning the first sheet of metal wire material. Then, the second metal wire sheet is placed on the first metal wire sheet by using an electrically conductive adhesive, and the patterning is performed. When the second metal wire sheet is placed on the first metal wire sheet and patterned, a wiring pattern is formed excluding the areas corresponding with recesses 56a. It should be noted that these three methods are examples and are also applicable to the second to fourth embodiments. In the case of the third embodiment, the above-described three methods can also be applied to the formation of the recesses in the inner leads of the COF film carrier 10.

Figure 9:
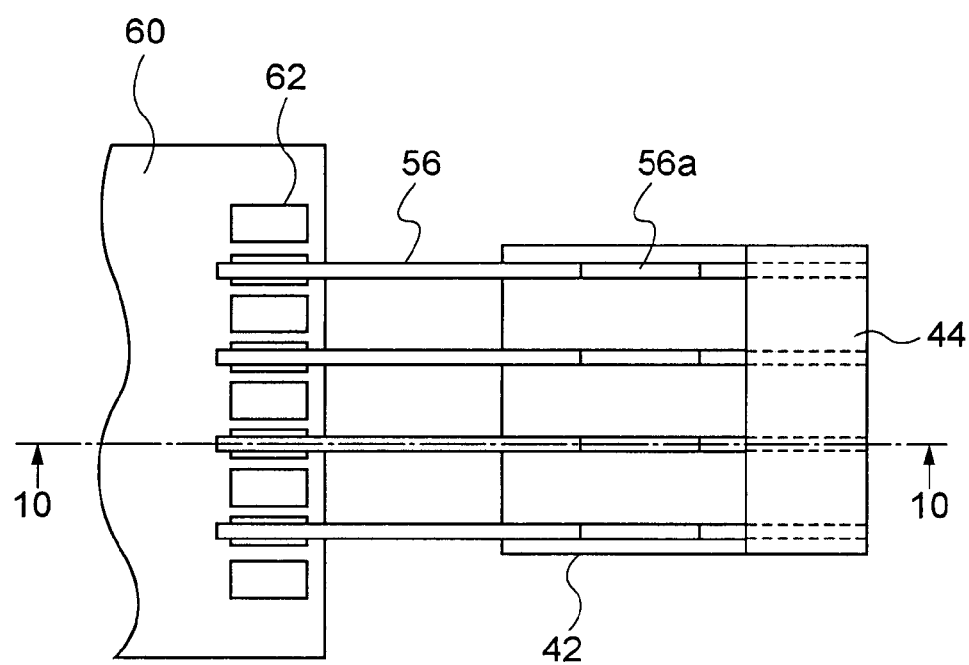
FIG. 9 is a partial plan view of a semiconductor chip that is bonded to a TCP tape carrier used for the semiconductor package according to the first embodiment.
Figure 10:
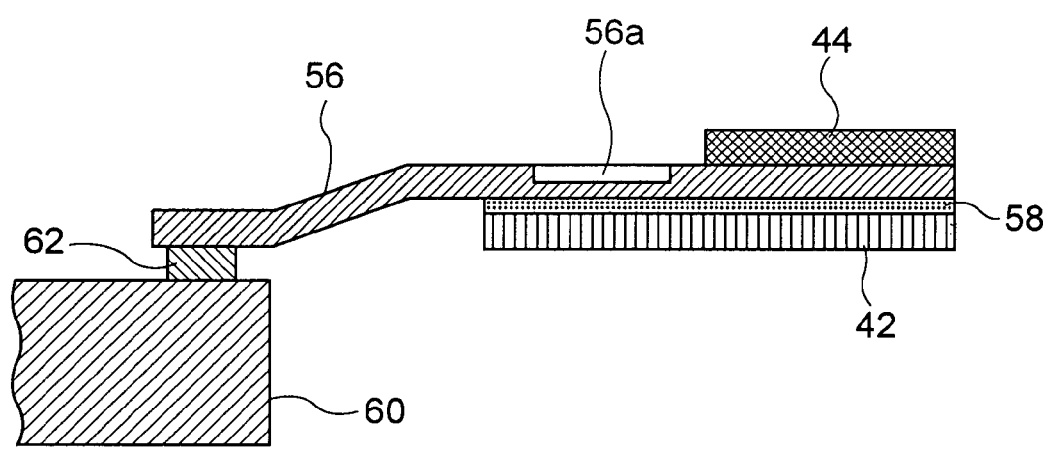
FIG. 10 is a cross-sectional view taken along the line 10-10 in FIG. 9.

FIG. 9 is a partial plan view of a state where a semiconductor 60 is bonded to the TCP tape carrier 40. This is the inner lead bonding. FIG. 10 is a cross-sectional view taken along the line 10-10 in FIG. 9. Bumps 62 are formed on the semiconductor chip 60 and the free ends of the inner leads 56 are connected by means of thermal bonding to the bumps 62.

Figure 11:
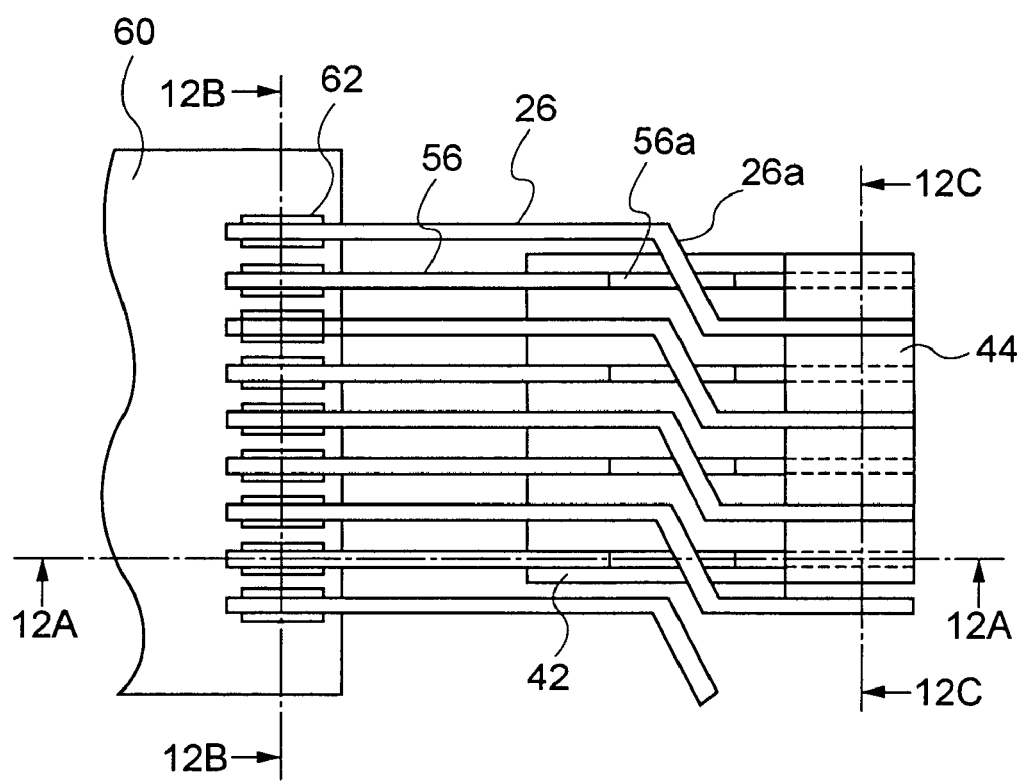
FIG. 11 is a partial plan view of a COF film carrier that is mounted after bonding the semiconductor chip to the TCP tape carrier according to the first embodiment.
Figure 12A:
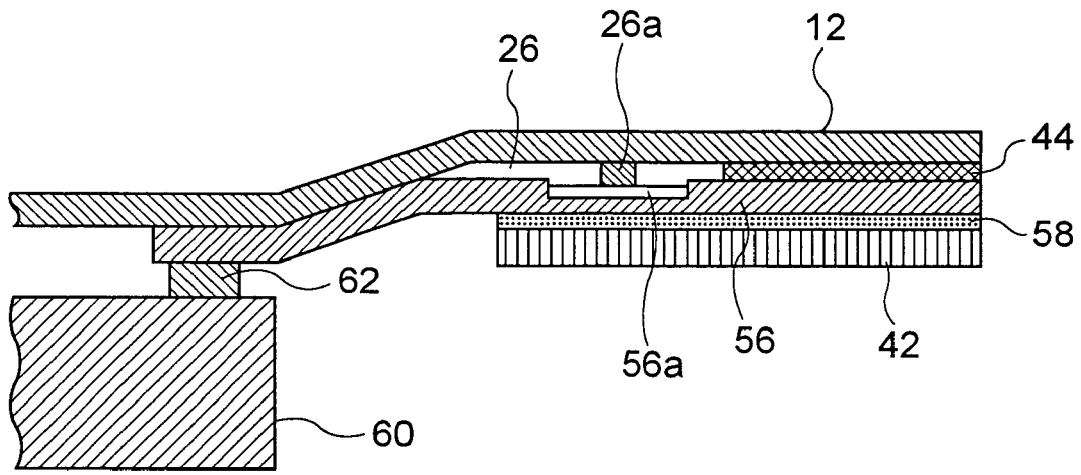
FIG. 12A is a cross-sectional view taken along the line 12A-12A in FIG. 11.
Figure 12B:
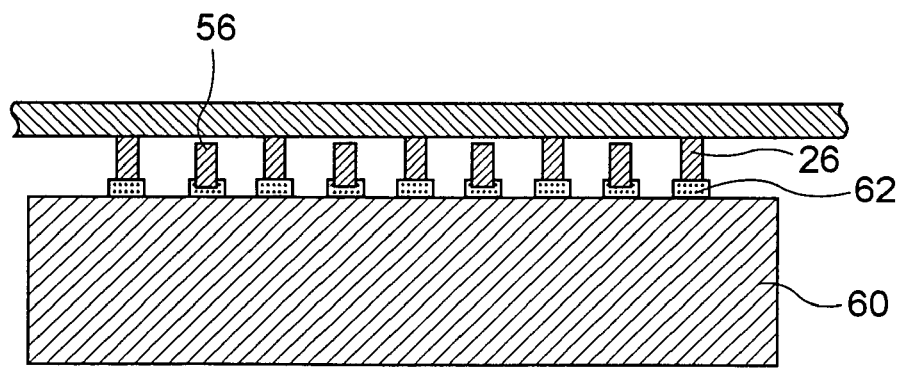
FIG. 12B is a cross-sectional view taken along the line 12B-12B in FIG. 11.
Figure 12C:
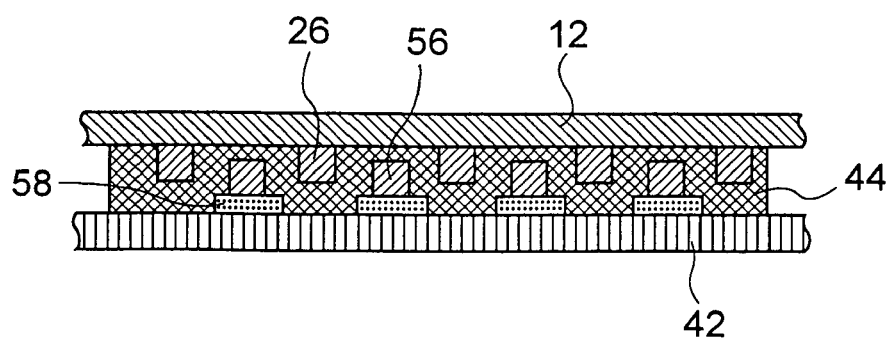
FIG. 12C is a cross-sectional view taken along the line 12C-12C in FIG. 11.

FIG. 11 is a partial plan view of a state where the COF film carrier 10 is mounted after bonding the semiconductor chip 60 to the TCP tape carrier 40. For the sake of description, FIG. 11 shows the COF film carrier 10 with only the inner leads 26, and other elements are omitted. FIG. 12A is a cross-sectional view taken along the line 12A-12A in FIG. 11, FIG. 12B is a cross-sectional view taken along the line 12B-12B in FIG. 11, and FIG. 12C is a cross-sectional view taken along the line 12C-12C in FIG. 11. After the semiconductor chip 60 is bonded to the TCP tape carrier 40, the COF film carrier 10 shown in FIGS. 1 to 4B is mounted in an upside down state. The ends of the inner leads 26 of the COF film carrier 10 are connected by thermal bonding to the bumps 62 formed on the semiconductor chip 60. As a result, the bent portions 26a of the inner leads 26 of the COF film carrier 10 cross, on a one-to-one basis, the recesses 56a in the inner leads 56 of the TCP tape carrier 40. The linear portions of the inner leads 56 and 26 are arranged spaced apart from one another in a parallel state. The inner leads 56 and 26 are isolated (insulated) by a space in the recesses 56a of the inner leads 56.

When the TCP tape carrier 40 and COF film carrier 10 are bonded to one another, an adhesive is applied to the surface of the resist 44 beforehand, and the resist is bonded to the resist by means of thermal bonding during the inner lead bonding step of the COF film carrier 10. The adhesive is preferably of an insulating material. It should be noted that if bonding of only the resists is executed, the adhesive need not necessarily be insulating.

Alternatively, the TCP tape carrier 40 and COF film carrier 10 can be bonded to one another by means of the injection of resin as is performed in a general resin sealing step for a COF assembly. That is, after causing the TCP tape carrier 40 and COF film carrier 10 to overlap one another as shown in FIG. 11, the TCP tape carrier 40 and COF film carrier 10 are vertically inverted and resin is injected between the COF film carrier 10 and semiconductor chip 60. The resin is injected between the resist 44 of the TCP tape carrier 40 and the resist 14 of the COF film carrier 10 and then cured. The injection resin is the insulating resin.

The semiconductor package according to this embodiment achieves higher wiring densities and increases the degree of freedom of the wiring design by implementing the three-dimensional crossing of the inner leads.

Second Embodiment

Figure 13:
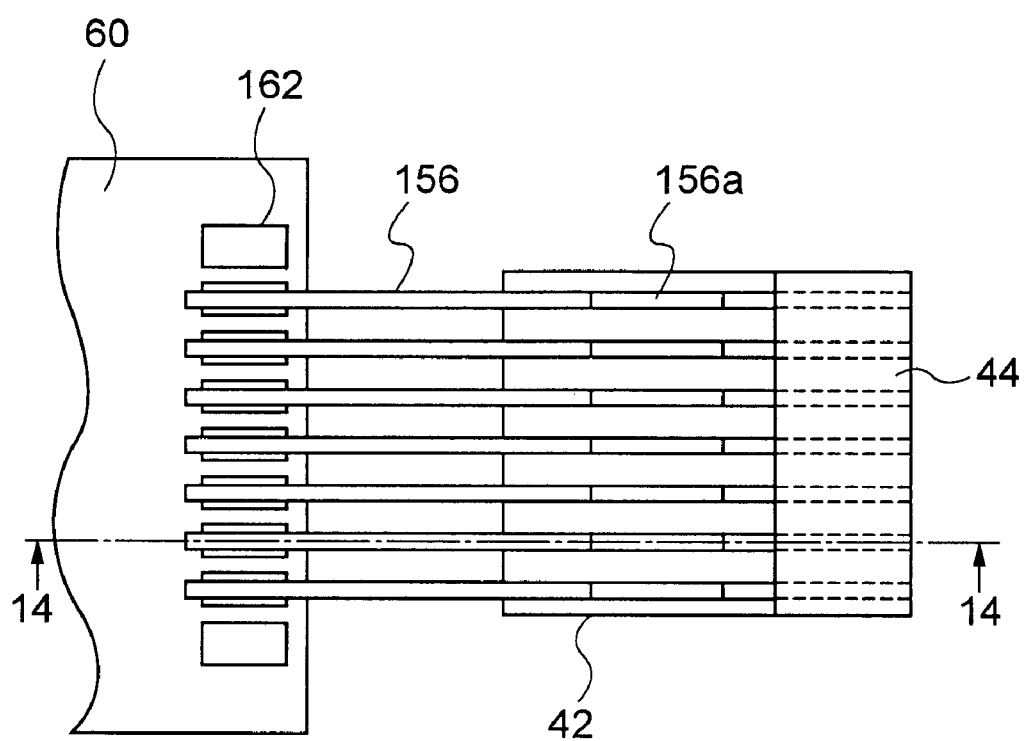
FIG. 13 is a plan view of the TCP tape carrier used for the semiconductor package according to the second embodiment of the present invention and shows a state where a semiconductor chip is bonded.
Figure 14:
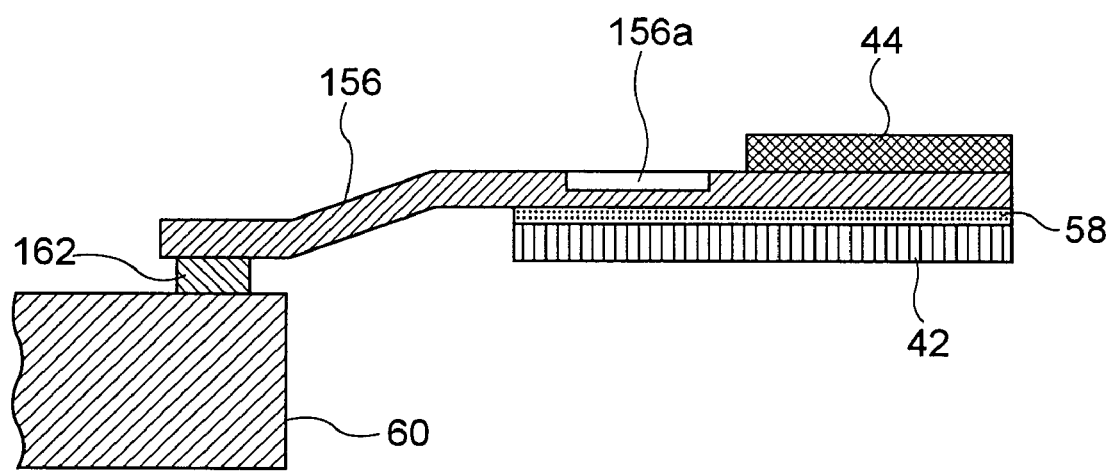
FIG. 14 is a cross-sectional view taken along the line 14-14 in FIG. 13.

FIG. 13 is a plan view of the TCP tape carrier used for the semiconductor package according to the second embodiment of the present invention and shows a state where a semiconductor chip 60 is bonded. FIG. 14 is a cross-sectional view taken along the line 14-14 in FIG. 13. In this embodiment, the same reference numerals and symbols are assigned to the elements that are the same as or correspond with the first embodiment and repetitive descriptions are avoided.

The structure of the TCP tape carrier 40 according to this embodiment is basically the same as that of the TCP tape carrier 40 of the first embodiment. Specifically, the structure of FIGS. 5 and 6 can be adopted. The input terminal 48 and output terminal 50 are formed on a substrate (tape) 42. The input and output terminals are made from a metal wiring material. The substrate 42 has a thickness of about 75 μm. An open portion 54 for mounting the semiconductor chip 60 is formed on the substrate 42. Areas of the metal wiring material other than those areas for the input terminal 48, output terminal 50, and inner lead 156 are protected by the resist 44.

Like the first embodiment, metal wiring 48, 50, 156 is bonded on the substrate 42 by an adhesive 58. The thickness of the metal wiring 48, 50, 156 is about 15 μm, the thickness of the resist 44 is about 25 μm, and the thickness of the adhesive 58 is about 12 μm.

As shown in FIGS. 13 and 14, a recess 156a is formed in each of the inner leads 156. The inner leads 156 extend linearly to the open portion 54. The positions of the recesses 156a correspond with (or intersect) the bent portion 126a of the inner lead 126 of the COF film carrier in the subsequent assembly step. The recesses 156a are preferably located above the substrate 42. If the recesses 156a are formed in a position of protrusion from the substrate 42, there is the risk that the positions of the intersections between the inner leads 126 and the recesses 156a in the perpendicular direction (vertical direction in FIG. 14) will become unstable.

Like the first embodiment, bumps 162 are formed on the semiconductor chip 60. The ends of the inner leads 156 are connected by thermal bonding to the bumps 162.

Figure 15:
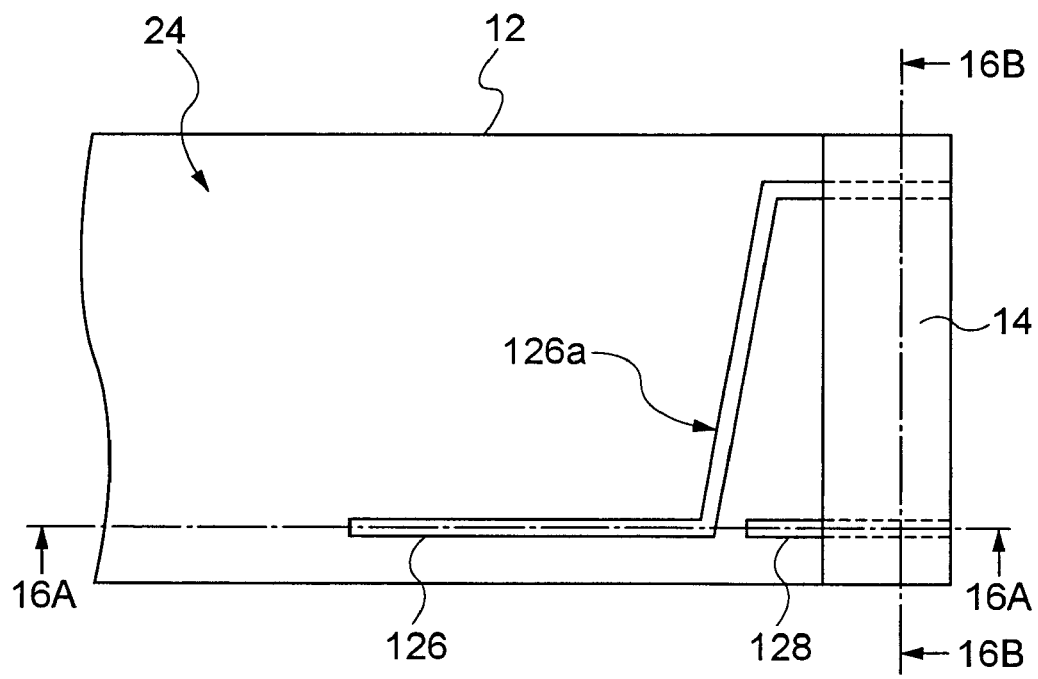
FIG. 15 is a plan view of part of the COF film carrier used for the semiconductor package according to the second embodiment.
Figure 16A:
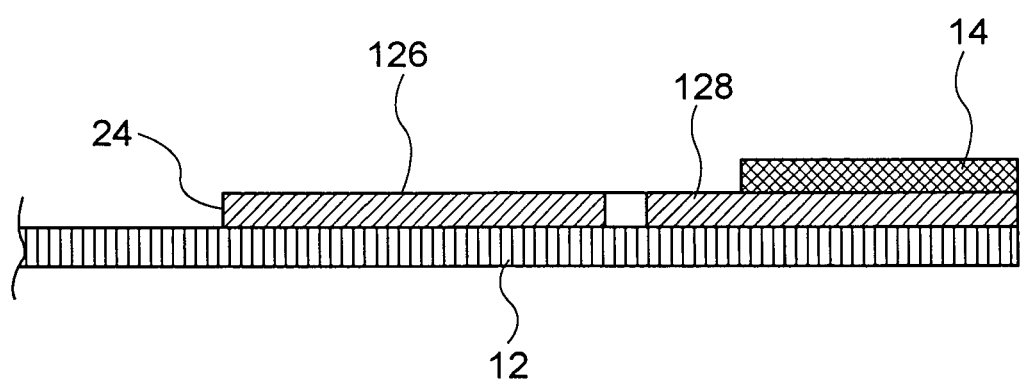
FIG. 16A is a cross-sectional view taken along the line 16A-16A in FIG. 15.
Figure 16B:
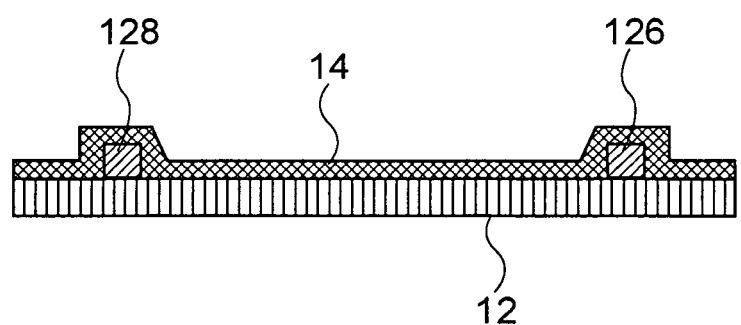
FIG. 16B is a cross-sectional view taken along the line 16B-16B in FIG. 15.

FIG. 15 is a plan view of part of the COF film carrier used for the semiconductor package according to the second embodiment. FIG. 16A is a cross-sectional view taken along the line 16A-16A in FIG. 15, and FIG. 16B is a cross-sectional view taken along the line 16B-16B in FIG. 15. The COF film carrier has an input terminal and an output terminal formed on a substrate (film) 12. The input and output terminals are made from a metal wiring material (not illustrated). The substrate 12 has a thickness of about 38 μm. An open portion 24 for mounting the semiconductor chip 60 is formed on the substrate 12. Areas of the metal wiring material other than those areas for the input terminal, output terminal, and inner leads 126 and 128 are protected by the resist 14.

The metal wiring 126, 128 and other metal wiring are directly formed on the substrate 12 by casting and plating, for example. The thickness of the metal wiring is about 8 μm and the thickness of the resist 14 is about 25 μm.

As shown in FIG. 15, the inner lead 126 is molded in an S-shape or stepped shape. The inner lead 126 has a linear portion that extends linearly toward the open portion 24 and a bent portion (oblique portion) 126a. It should be noted that another shape such as a Z shape can also be adopted as the shape of the inner lead. In this embodiment, the inner lead 126 intersects a plurality of inner leads 156 of the TCP tape carrier.

Figure 17:
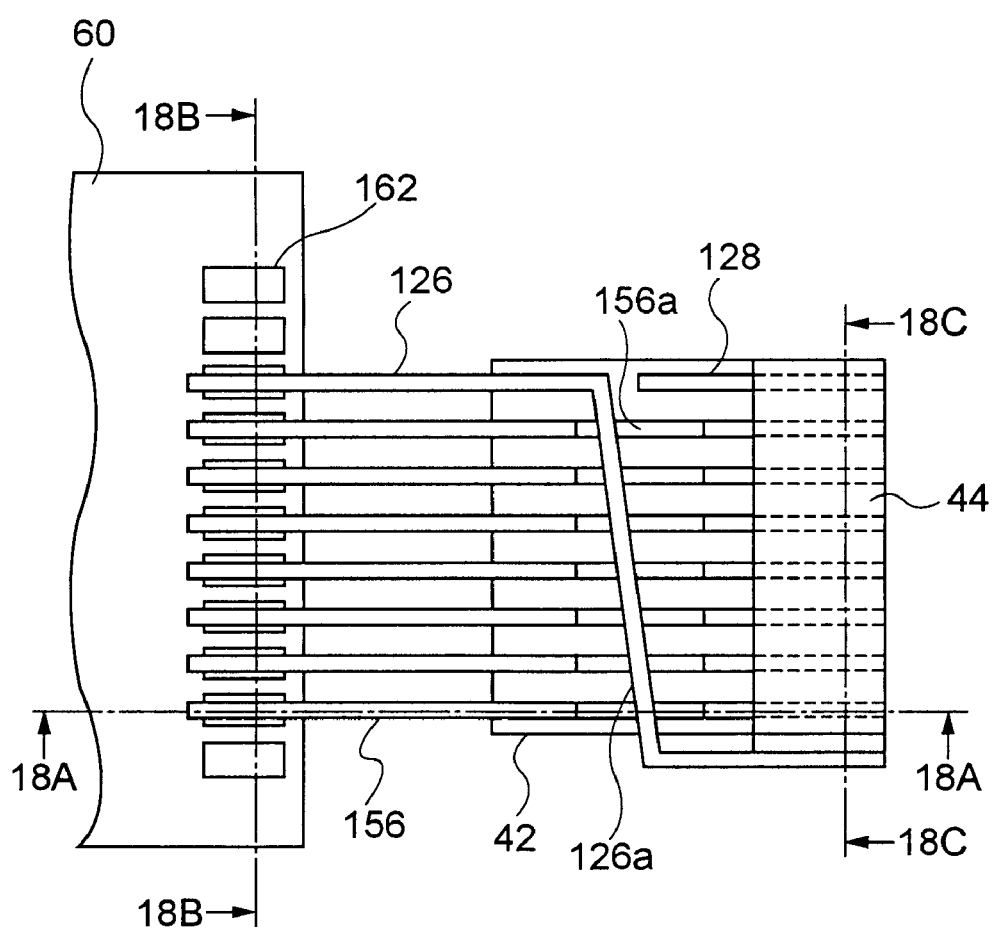
FIG. 17 is a plan view of the principal parts of the semiconductor package according to the second embodiment and shows a state where a semiconductor chip is bonded to the TCP tape carrier and COF film carrier.
Figure 18A:
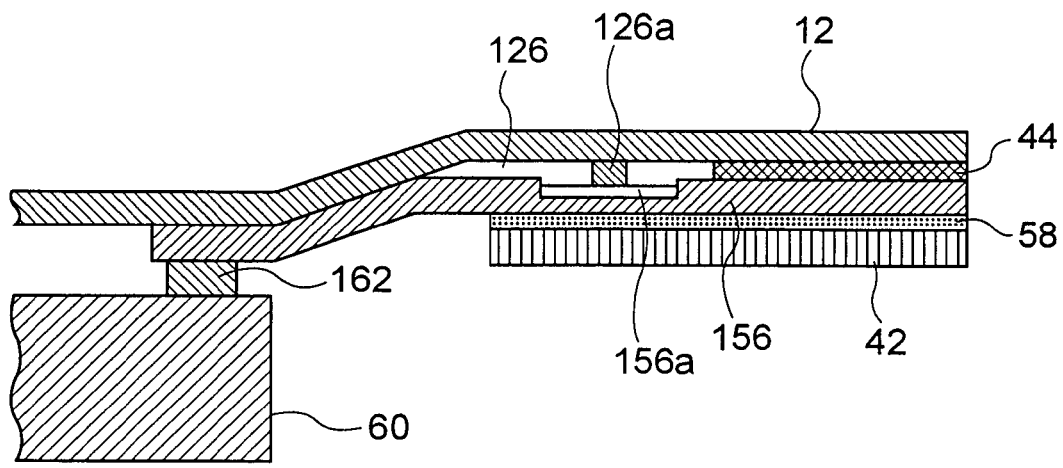
FIG. 18A is a cross-sectional view taken along the line 18A-18A in FIG. 17.
Figure 18B:
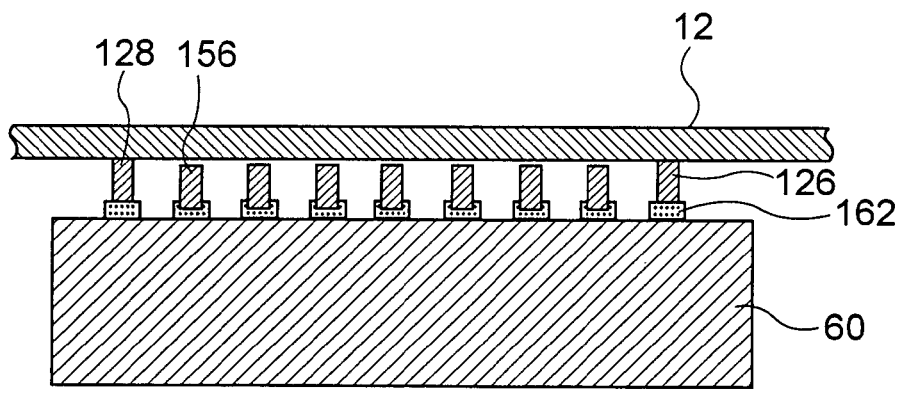
FIG. 18B is a cross-sectional view taken along the line 18B-18B in FIG. 17.
Figure 18C:
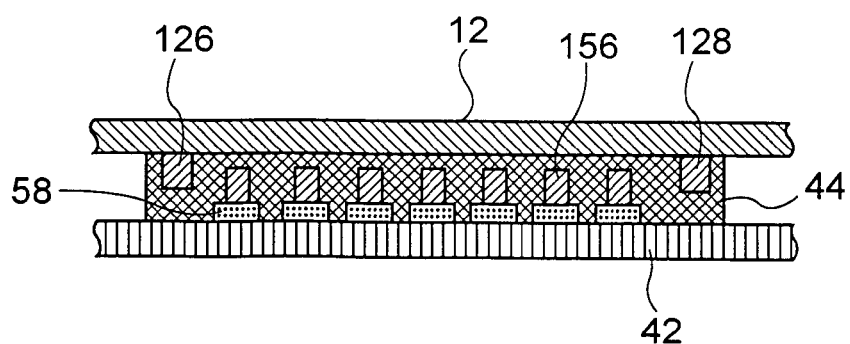
FIG. 18C is a cross-sectional view taken along the line 18C-18C in FIG. 17.

FIG. 17 is a plan view of the principal parts of the semiconductor package according to the second embodiment and shows a state where a semiconductor chip 60 is bonded to the TCP tape carrier and COF film carrier. For the sake of description, FIG. 17 shows the COF film carrier together with only the inner lead 126, and other elements are omitted. FIG. 18A is a cross-sectional view taken along the line 18A-18A in FIG. 17, FIG. 18B is a cross-sectional view taken along the line 18B-18B in FIG. 17, and FIG. 18C is a cross-sectional view taken along the line 18C-18C in FIG. 17. After bonding the semiconductor chip 60 to the TCP tape carrier, the COF film carrier shown in FIGS. 15, 16A and 16B is mounted in an upside down state. The end of the inner lead 126 of the COF film carrier is connected through thermal bonding to the bump 62 formed on the semiconductor chip 60. Here, the bent portion 126a of the inner lead 126 of the COF film carrier crosses the recesses 156a formed in the inner leads 156 of the TCP tape carrier. The inner leads 156 and 126 are isolated by a space in the recesses 156a of the inner leads 156.

The same method as that used in the first embodiment can be adopted as the method for bonding the TCP tape carrier 40 to the COF film carrier 10.

As described earlier, the semiconductor package of the second embodiment can achieve the same advantages as the first embodiment. Also, the semiconductor package of the second embodiment can allow the change in the inner lead arrangement in an easy manner. Thus, it is possible to provide a semiconductor package which has different input and output terminal arrangements by using the same semiconductor chip.

Third Embodiment

Figure 19:
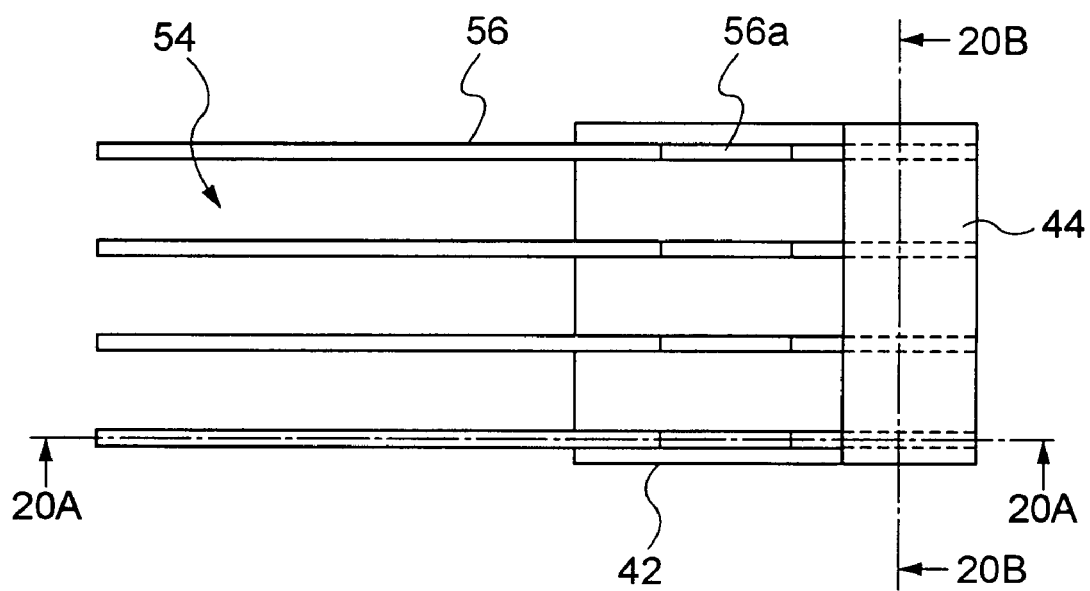
FIG. 19 is a plan view of part of the TCP tape carrier used for the semiconductor package according to the third embodiment of the present invention.
Figure 20A:
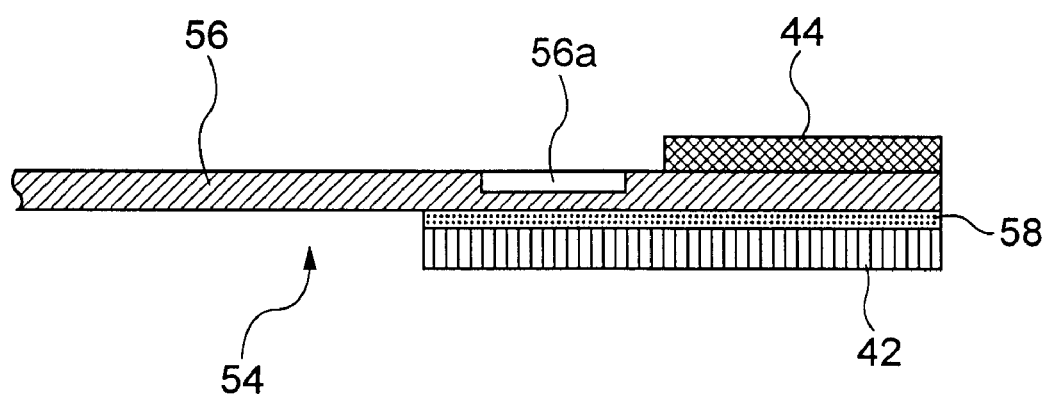
FIG. 20A is a cross-sectional view taken along the line 20A-20A in FIG. 19.
Figure 20B:
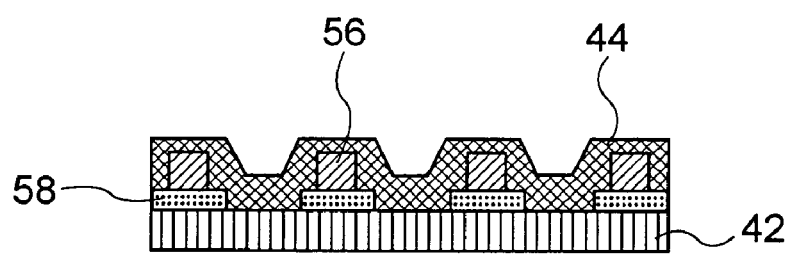
FIG. 20B is a cross-sectional view taken along the line 20B-20B in FIG. 19.

FIG. 19 is a plan view of part of the TCP tape carrier used for the semiconductor package according to the third embodiment of the present invention. FIG. 20A is a cross-sectional view taken along the line 20A-20A in FIG. 19 and FIG. 20B is a cross-sectional view taken along the line 20B-20B in FIG. 19. In this embodiment, the same reference numerals and symbols are assigned to the elements that are the same as or correspond with the first and second embodiments, and repetitive descriptions are avoided.

The TCP tape carrier used in this embodiment is basically the same as that used in the first embodiment. Specifically, the TCP tape carrier has an input terminal and output terminal on the substrate (tape) 42. The input and output terminals are made from a metal wiring material (not illustrated). The substrate has a thickness of about 75 μm. An open portion 54 for mounting the semiconductor chip 60 is formed on the substrate 42. Areas of the metal wiring material other than those areas for the input terminal, output terminal, and inner leads 56 are protected by the resist 44.

Metal wiring 48, 50, 56 is bonded to the substrate material 42 by adhesive 58. The thickness of the metal wiring 48, 50, 56 is about 15 μm, the thickness of the resist 44 is about 25 μm, and the thickness of the adhesive 58 is about 12 μm. A recess 56a is formed in each of the inner leads 56. The inner leads 56 extend linearly to the open portion 54. The positions of the recesses 56a correspond with (intersect) the bent portions 226a of the inner leads 226 of the COF film carrier in the subsequent assembly step. The recesses 56a are preferably located above the substrate 42. When the recesses 56a are formed in a position of protrusion from the substrate 42, there is the risk that the positions of the intersections between the inner leads 226 and the recesses 56a in the perpendicular direction (vertical direction in FIG. 20A) will become unstable.

Figure 21:
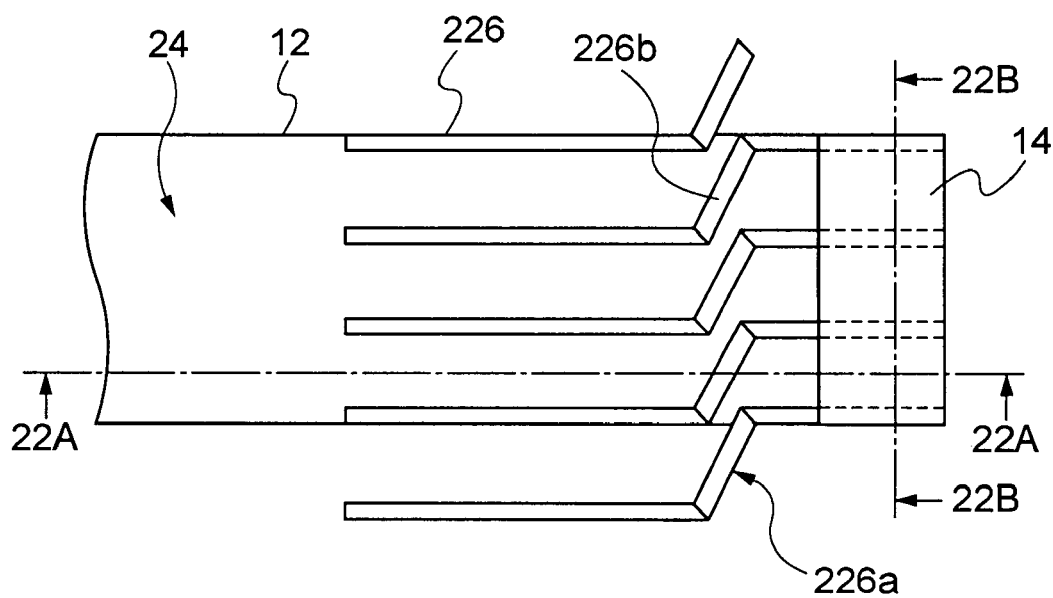
FIG. 21 is a plan view of part of the COF film carrier used for the semiconductor package according to the third embodiment.
Figure 22A:
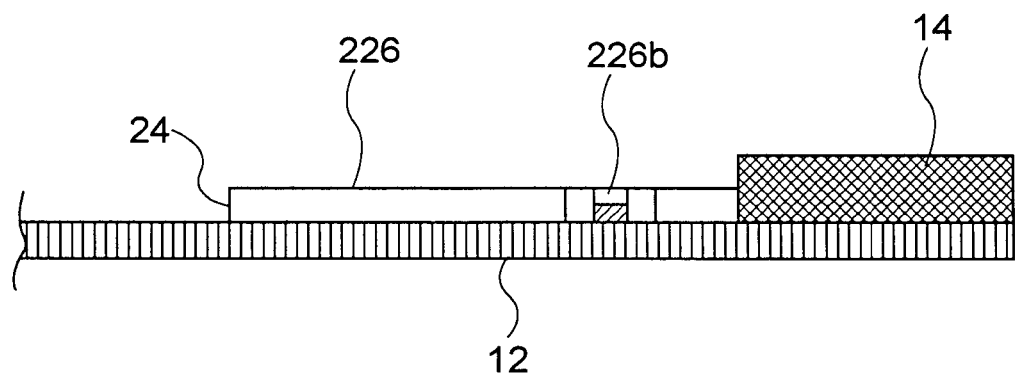
FIG. 22A is a cross-sectional view taken along the line 22A-22A in FIG. 21.
Figure 22B:
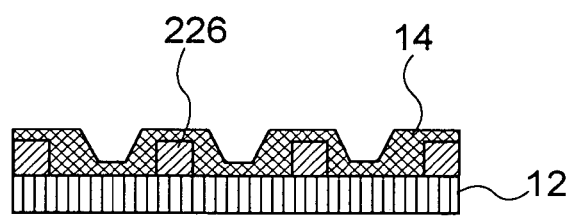
FIG. 22B is a cross-sectional view taken along the line 22B-22B in FIG. 21.

FIG. 21 is a plan view of part of the COF film carrier used for the semiconductor package according to the third embodiment. FIG. 22A is a cross-sectional view taken along the line 22A-22A in FIG. 21 and FIG. 22B is a cross-sectional view taken along the line 22B-22B in FIG. 21. The COF film carrier has an input terminal and output terminal on a substrate (film) 12. The input and output terminals are made from a metal wiring material (not illustrated). The substrate 12 has a thickness of about 38 μm. An open portion 24 for mounting a semiconductor chip 60 is formed on the substrate 12. Areas of the metal wiring material other than those areas for the input terminal, output terminal, and inner leads 226 are protected by the resist 14.

The metal wiring 18, 20, 226 is directly formed on the substrate 12 by casting and plating, for example. The thickness of the metal wiring 18, 20, 226 is about 8 μm and the thickness of the resist 14 is about 25 μm.

As shown in FIG. 21, the inner leads 226 are molded in an S-shape or stepped shape. Each inner lead 226 has a linear portion that extends linearly toward the open portion 24 and a bent portion (oblique portion) 226a. It should be noted that the shape of the inner lead may be another shape such as a Z shape. A recess 226b is formed in the bent portion 226a of each inner lead 226. In this embodiment, the recesses 56a and 226b are formed in both the TCP inner leads 56 and the COF inner leads 226, and the recesses 56a overlap the recesses 226b so that the recesses 56a and 226b intersect one another with a gap.

Figure 23:
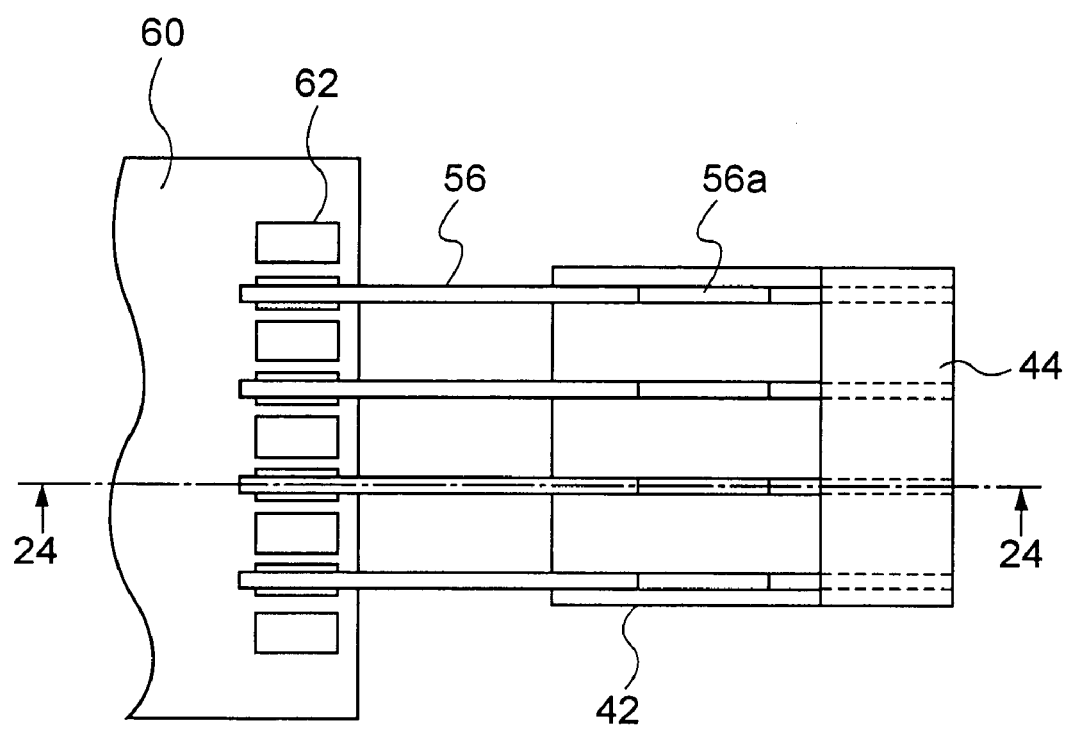
FIG. 23 is a partial plan view of a semiconductor chip that is bonded to a TCP tape carrier shown in FIG. 19.
Figure 24:
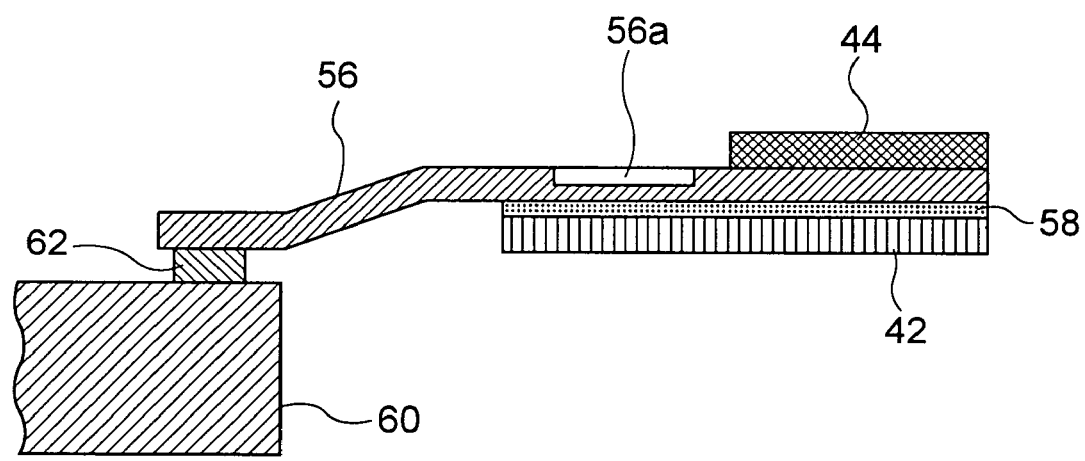
FIG. 24 is a cross-sectional view taken along the line 24-24 in FIG. 23.

FIG. 23 is a partial plan view of a state where a semiconductor chip is bonded to a TCP tape carrier (FIG. 19) according to the third embodiment. FIG. 24 is a cross-sectional view taken along the line 24-24 in FIG. 23. Bumps 62 are formed on the semiconductor chip 60 and the ends of the inner leads 56 are connected by means of thermal bonding to the bumps 62.

Figure 25:
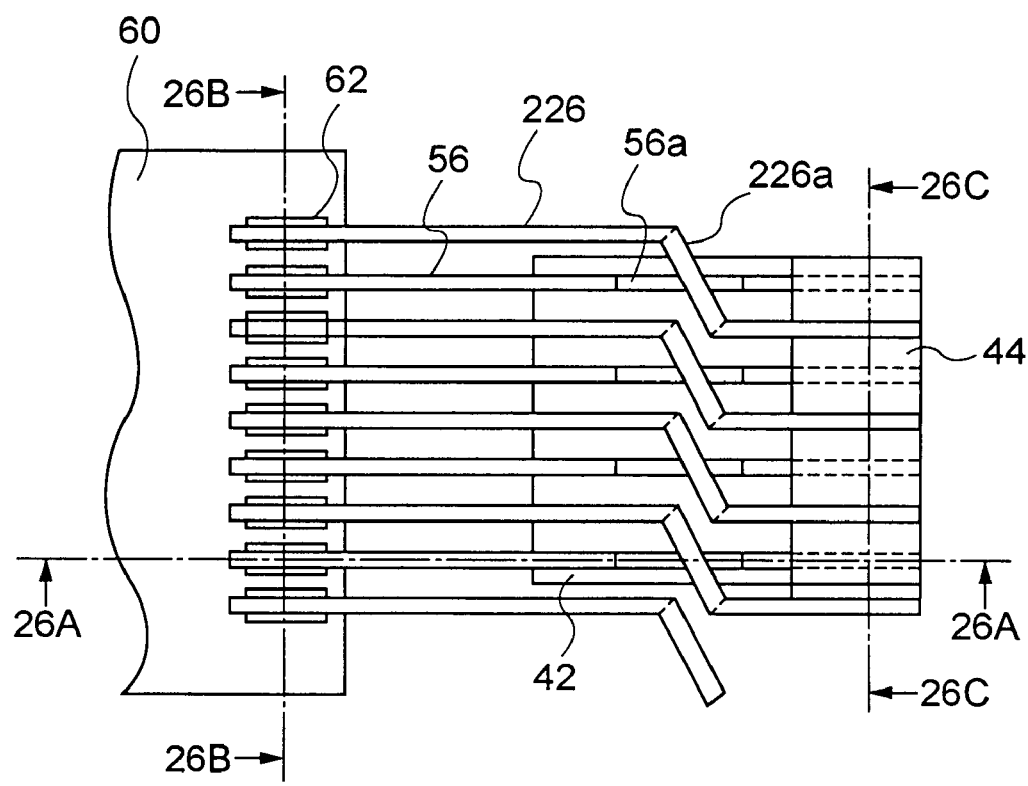
FIG. 25 is a plan view of the principal parts of the semiconductor package according to the third embodiment and shows a state where a semiconductor chip is bonded to a TCP tape carrier and COF film carrier.
Figure 26A:
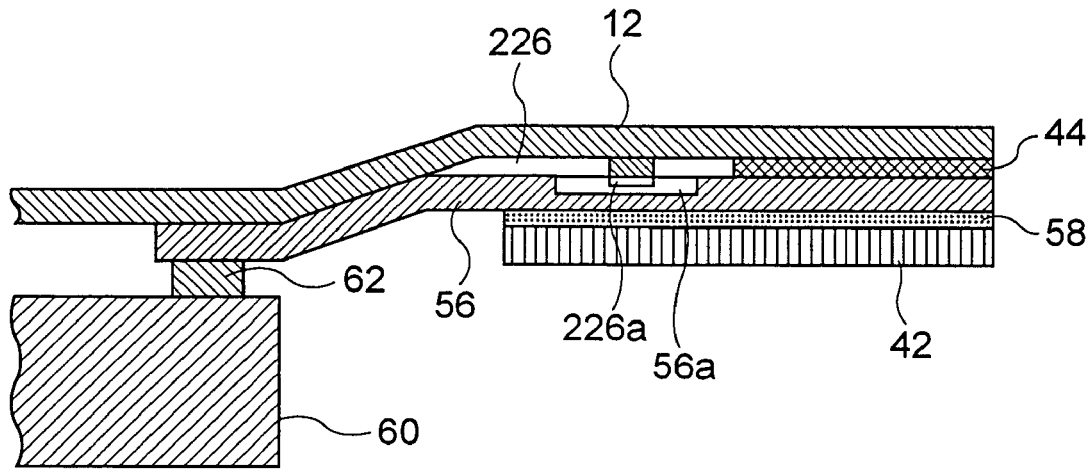
FIG. 26A is a cross-sectional view taken along the line 26A-26A in FIG. 25.
Figure 26B:
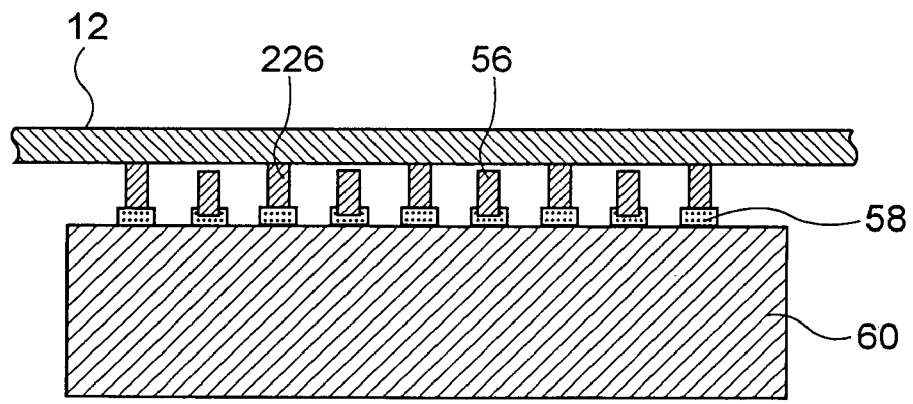
FIG. 26B is a cross-sectional view taken along the line 26B-26B in FIG. 25.

FIG. 25 is a plan view of the principal parts of the semiconductor package according to the third embodiment and shows the semiconductor chip 60 bonded to a TCP tape carrier and COF film carrier. For the sake of description, FIG. 25 shows the COF film carrier 10 together with the inner leads 266 only. Other elements are omitted. FIG. 26A is a cross-sectional view taken along the line 26A-26A in FIG. 25, FIG.

Figure 26C:
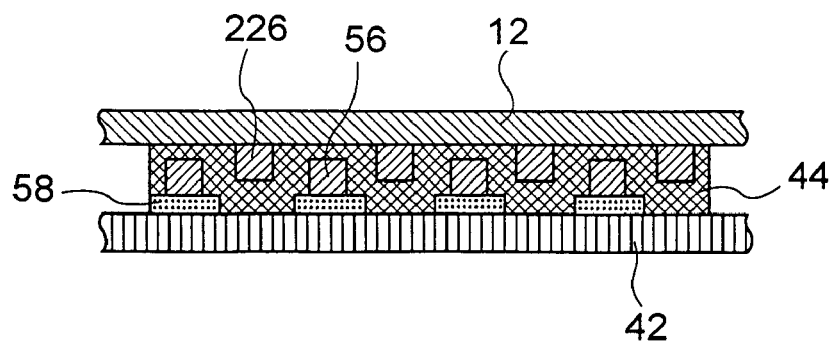
FIG. 26C is a cross-sectional view taken along the line 26C-26C in FIG. 25.

26B is a cross-sectional view taken along the line 26B-26B in FIG. 25, and FIG. 26C is a cross-sectional view taken along the line 26C-26C in FIG. 25. After the semiconductor chip 60 is bonded to the TCP tape carrier 40, the COF film carrier 10 shown in FIGS. 21 and 22 is mounted in an upside down state. The ends of the inner leads 226 of the COF film carrier are connected by thermal bonding to the bumps 62 formed on the semiconductor chip 60. Here, the bent portions 226a (or the recesses 226b) of the inner leads 226 of the COF film carrier cross, on a one-to-one basis, the recesses 56a in the inner leads 56 of the TCP tape carrier. The linear portions of the inner leads 56 and 226 are arranged spaced apart from one another in parallel within the same plane. The inner leads 56 are isolated from the inner leads 226 by a space in the recesses 56a of the inner leads 56.

The same method as that used in the first embodiment can be adopted as the method for bonding the TCP tape carrier 40 and COF film carrier 10 to one another.

As described above, the semiconductor package according to this embodiment has the recesses 56a and 226a which spacedly mesh with one another. Therefore, in comparison with the first embodiment, it is possible to provide a semiconductor package that is thin and permits a reduction in assembly defects caused by the contact between the wiring material.

Fourth Embodiment

Figure 27:
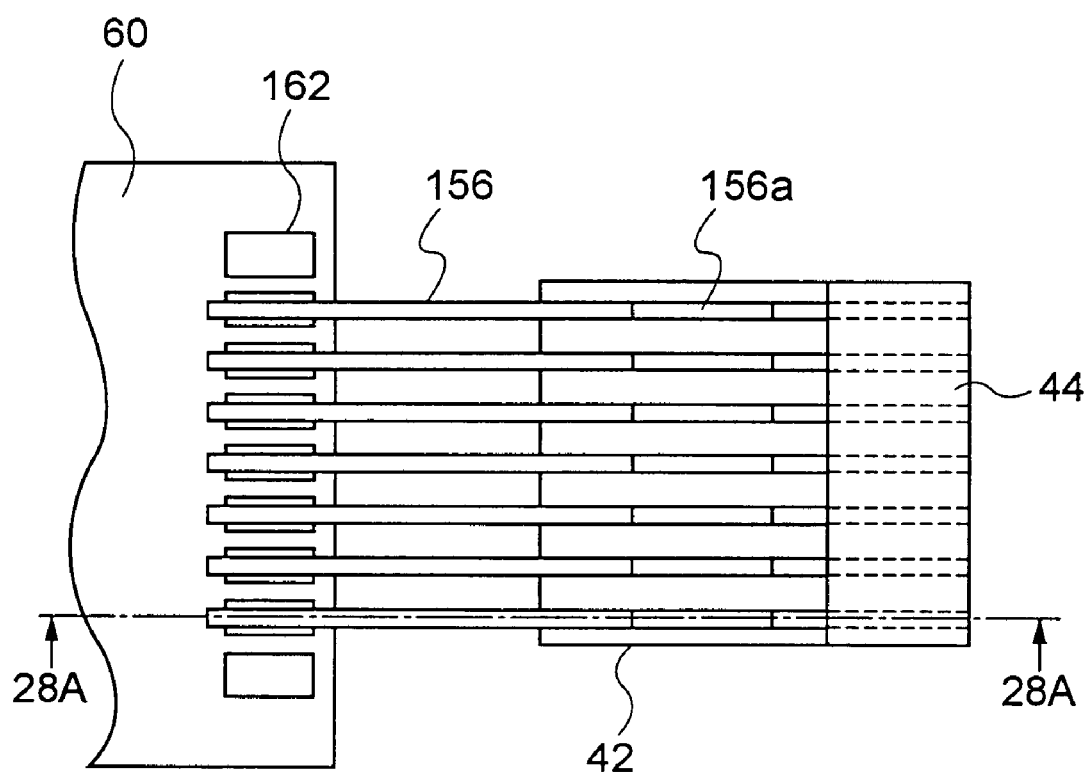
FIG. 27 is a partial plan view of a semiconductor chip that is bonded to a TCP tape carrier according to the fourth embodiment of the present invention.
Figure 28A:
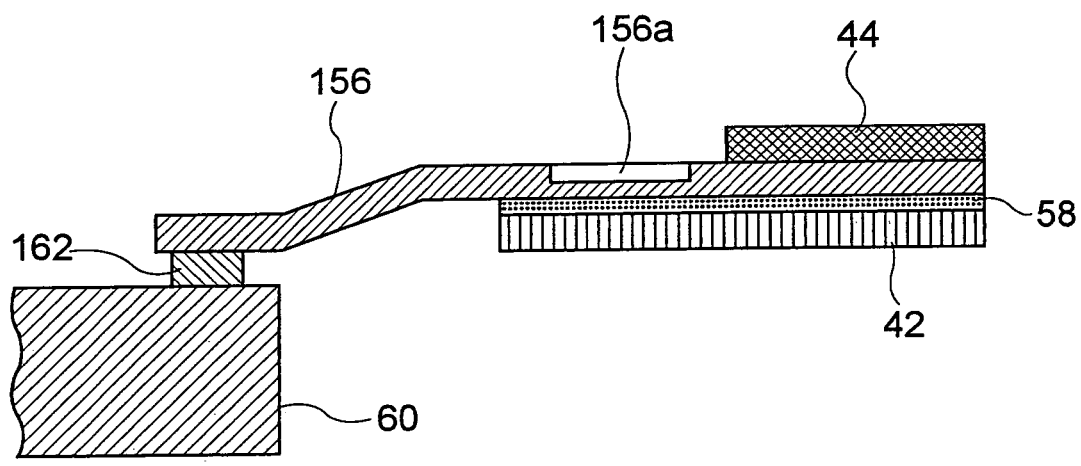
FIG. 28A is a cross-sectional view taken along the line 28A-28A in FIG. 27.

FIG. 27 is a partial plan view showing the semiconductor chip 60 bonded to a TCP tape carrier according to the fourth embodiment of the present invention. FIG. 28A is across-sectional view taken along the line 28A-28A in FIG. 27. In this embodiment, the same reference numerals and symbols are assigned to the elements that are the same as or correspond with the first to third embodiments and repetitive descriptions are avoided. The structure of the TCP tape carrier 40 according to this embodiment is basically the same as that of the tape carrier of the second embodiment. The input terminal and output terminal are formed on a substrate (tape) 42. The input and output terminals are made from a metal wiring material (not illustrated). The substrate 42 has a thickness of about 75 μm. An open portion 54 for mounting the semiconductor chip 60 is formed on the substrate 42. Areas of the metal wiring material other than those areas for the input terminal, output terminal, and inner leads 156 are protected by the resist 44.

Like the first and second embodiments, metal wiring 48, 50, 156 is bonded on the substrate 42 by an adhesive 58. The thickness of the metal wiring 48, 50, 156 is about 15 μm, the thickness of the resist 44 is about 25 μm, and the thickness of the adhesive 58 is about 12 μm.

A recess 156a is formed in each of the inner leads 156. The inner leads 156 extend linearly to the open portion 54. The positions of the recesses 156a correspond with (intersect) the bent portion 326a of the inner lead 326 of the COF film carrier in the subsequent assembly step. The recesses 156a are preferably located above the substrate 42. When the recesses 156a are formed in a position of protrusion from the substrate 42, there is the risk that the positions of the intersections between the inner lead 326 and the recesses 156a in the perpendicular direction (vertical direction in FIG. 28A) will become unstable.

Like the first and second embodiments, bumps 162 are formed on the semiconductor chip 60. The ends of the inner leads 156 are connected by thermal bonding to the bumps 162.

Figure 29:
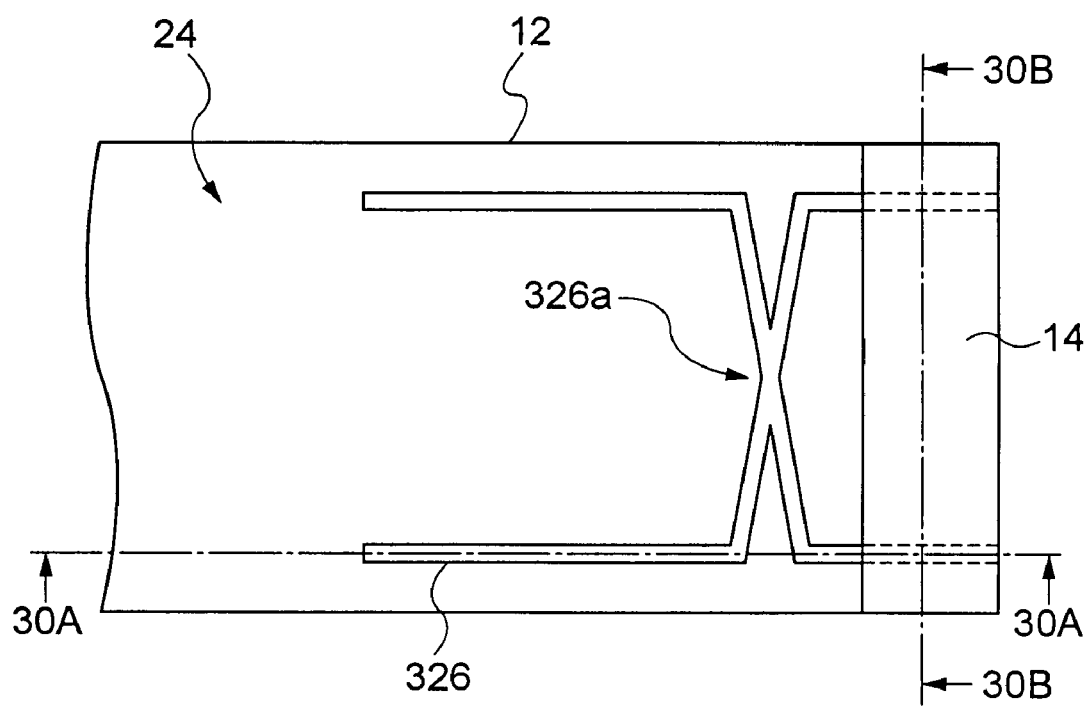
FIG. 29 is a plan view of part of the COF film carrier used for the semiconductor package according to the fourth embodiment of the present invention.
Figure 30A:
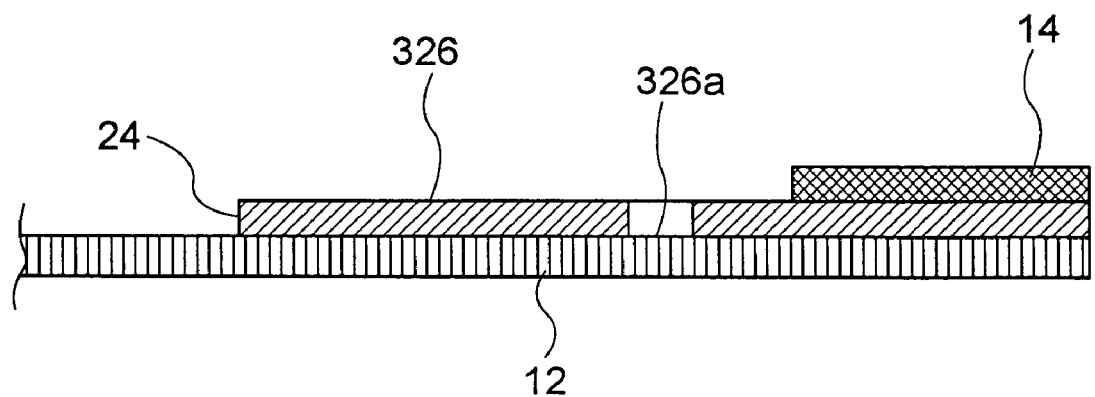
FIG. 30A is a cross-sectional view taken along the line 30A-30A in FIG. 29.
Figure 30B:
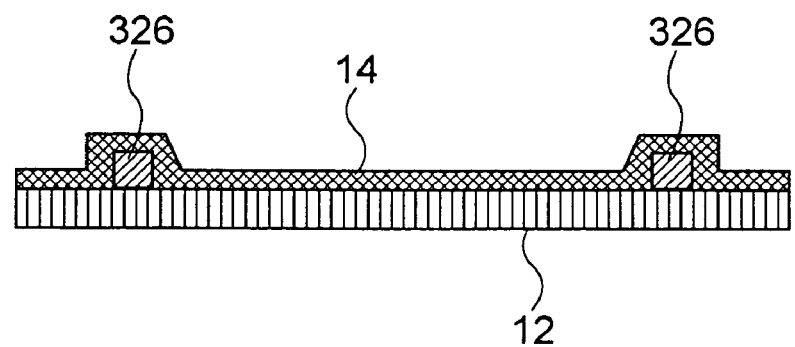
FIG. 30B is a cross-sectional view taken along the line 30B-30B in FIG. 29.

FIG. 29 is a plan view of part of the COF film carrier used for the semiconductor package according to the fourth embodiment. FIG. 30A is a cross-sectional view taken along the line 30A-30A in FIG. 29 and FIG. 30B is a cross-sectional view taken along the line 30B-30B in FIG. 29. The COF film carrier has an input terminal and an output terminal on a substrate (film) 12. The input and output terminals are made from a wiring material (not illustrated). The substrate 12 has a thickness of about 38 μm. An open portion 24 for mounting a semiconductor chip 60 is formed on the substrate 12. Areas of the metal wiring material other than those areas for the input terminal, output terminal, and inner lead 326 are protected by the resist 14.

The metal wiring 326 and other metal wiring are directly formed on the substrate 12 by casting and plating, for example. The thickness of the metal wiring is about 8 μm and the thickness of the resist 14 is about 25 μm.

Figure 31:
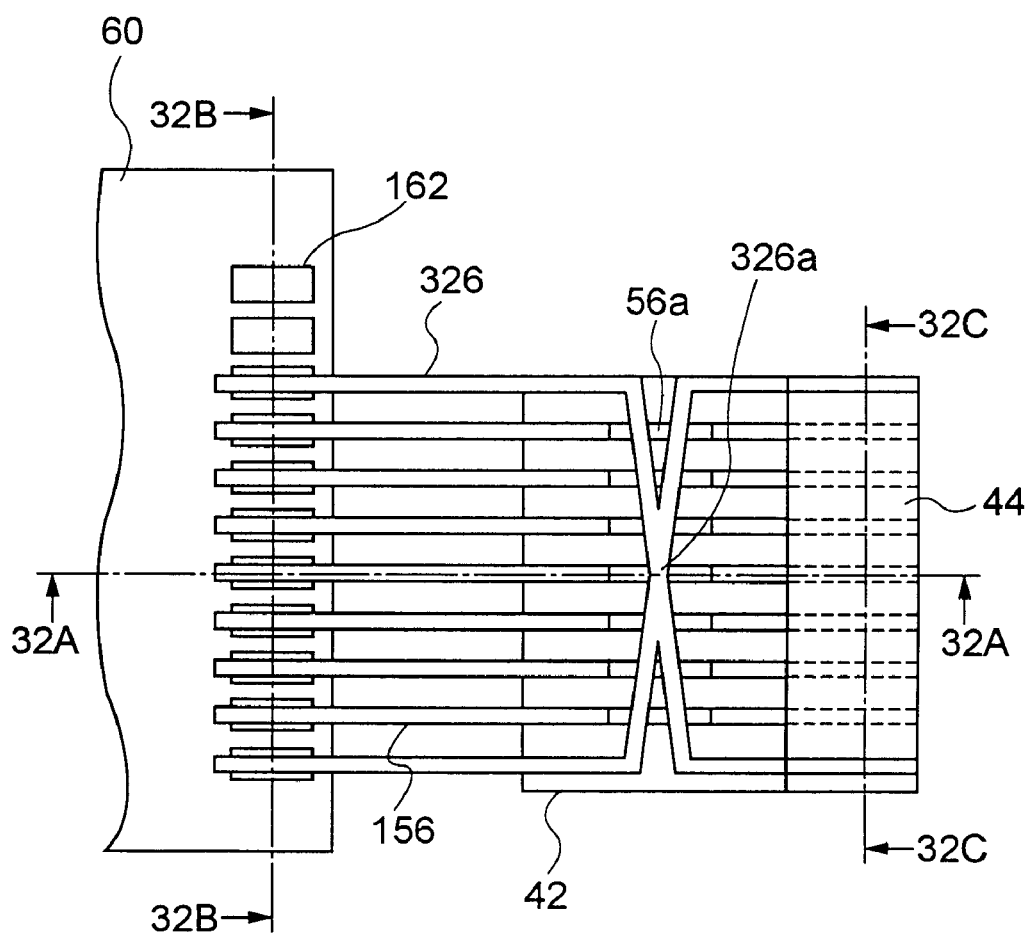
FIG. 31 is a plan view of the principal parts of the semiconductor package according to the fourth embodiment and shows a state where a semiconductor chip is bonded to a TCP tape carrier of FIG. 27 and COF film carrier of FIG. 29.

As shown in FIG. 29, the inner lead 326 has a shape with an intersection portion 326a and linear portions. The intersection portion 326a forms an X-like intersection, and the linear portions extend linearly toward the open portion 24. In this embodiment, the inner lead 326 intersects the seven inner leads 156 of the TCP tape carrier (FIG. 31). The position of the intersection portion 326a in the inner lead 326 can be suitably changed in accordance with the wiring design.

Figure 32A:
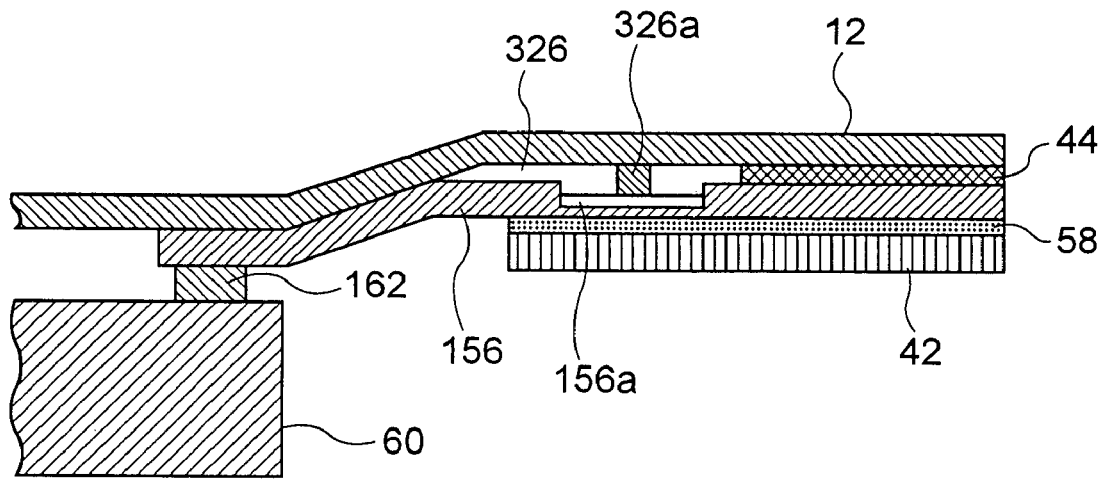
FIG. 32A is a cross-sectional view taken along the line 32A-32A in FIG. 31.
Figure 32B:
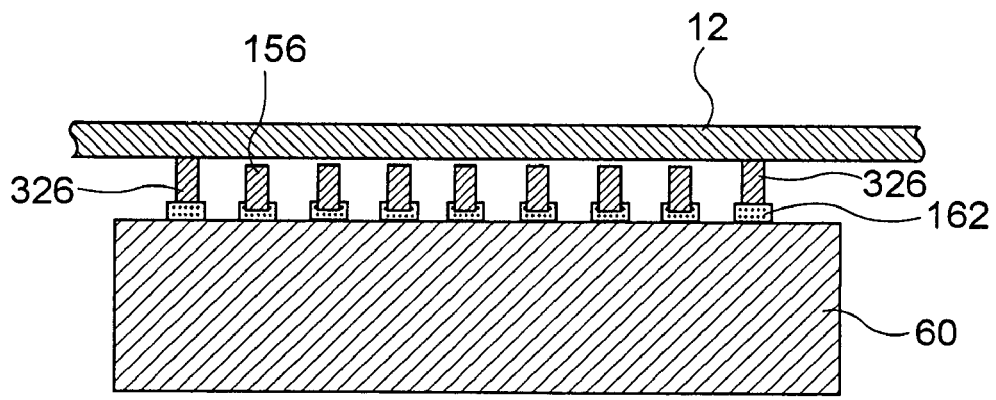
FIG. 32B is a cross-sectional view taken along the line 32B-32B in FIG. 31.
Figure 32C:
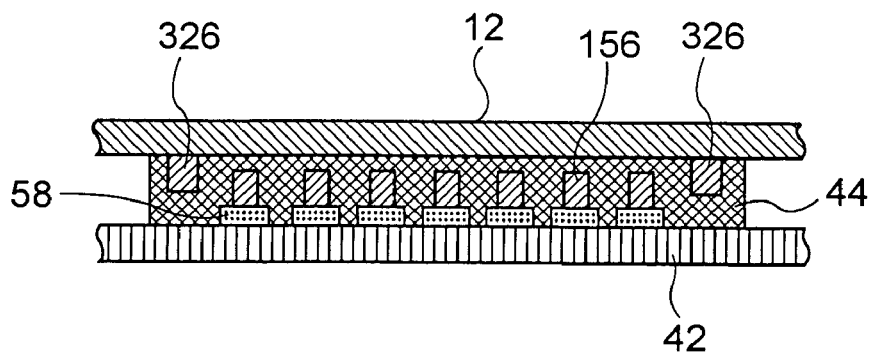
FIG. 32C is a cross-sectional view taken along the line 32C-32C in FIG. 31.

FIG. 31 is a plan view of the principal parts of the semiconductor package according to the fourth embodiment and shows a state where the semiconductor chip is bonded to the TCP tape carrier (FIG. 27) and COF film carrier (FIG. 29). For the sake of the description, FIG. 31 shows the COF film carrier 10 together with the inner lead 326 only. Other elements are omitted. FIG. 32A is a cross-sectional view taken along the line 32A-32A in FIG. 31, FIG. 32B is across-sectional view taken along the line 32B-32B in FIG. 31, and FIG. 32C is across-sectional view taken along the line 32C-32C in FIG. 31. After bonding the semiconductor chip 60 to the TCP tape carrier, the COF film carrier shown in FIGS. 29, 30A and 30B is mounted in an upside down state. The ends of the inner lead 326 of the COF film carrier are connected through thermal bonding to the bumps 62 formed on the semiconductor chip 60. The bent portion having the intersection portion 326a of the inner lead 326 of the COF film carrier is received in the recesses 156a formed in the inner leads 156 of the TCP tape carrier and crosses the inner leads 156. The inner lead 326 intersects one inner lead 156 twice. The inner leads 156 and 326 are isolated by a space in the recesses 156a of the inner leads 156.

The same method as that used in the first embodiment can be adopted as the method for bonding the TCP tape carrier 40 and COF film carrier 10 to one another.

As described above, the semiconductor package according to this embodiment does not require wiring in the open portion used to mount the semiconductor element, unlike a conventional COF product. Therefore, this embodiment can prevent or reduce generation of voids in the internal wiring portion in the resin sealing step.

The present invention is not limited to the above described embodiments. For example, the present invention can be applied when the TCP is connected to another TCP. The present invention can also be applied to a package device other than a semiconductor package. Although air isolation is employed when wiring of two layers is made to intersect in three dimensions in the illustrated embodiments, a general insulating material may be interposed between the layers when wiring of two layers is made to intersect in three dimensions. Specifically, an insulating resin may be injected in the intersection between the inner lead(s) of the TCP tape carrier 40 and the inner lead(s) of the COF film carrier 10. This can improve insulation-related reliability.

This application is based on Japanese Patent Application No. 2005-213948 filed on Jul. 25, 2005 and the entire disclosure thereof is incorporated herein by reference.

What is claimed is:

1. A semiconductor package, comprising:
   a first substrate having a first face and a second face;
   a first wiring provided on the first face of the first substrate;
   a second substrate having a first face and a second face;
   a second wiring provided on the first face of the second substrate;
   an insulation layer provided between the first and second wiring;
   a semiconductor chip connected to the first and second wiring; and
   first and second bumps provided on the semiconductor chip,
   wherein the first wiring is connected to the semiconductor chip via the first bump and the second wiring is connected to the semiconductor chip via the second bump, and
   wherein the first face of the first substrate faces the first face of the second substrate, and the first wiring crosses the second wiring and is electrically insulated from the second wiring by the insulation layer.

2. The semiconductor package according to claim 1, wherein at least one of the first and second wiring is formed with a recess in a position of intersection between the first and second wiring.

3. The semiconductor package according to claim 1, wherein at least one of the first and second wiring is bent in an S-shape or Z-shape and the bent portion of the first or second wiring intersects the other wiring.

4. The semiconductor package according to claim 1, wherein the first substrate is a TCP (tape carrier package) tape carrier and the second substrate is a COF (chip-on-film) film carrier.

5. The semiconductor package according to claim 1, wherein the first wiring includes a first inner lead and the second wiring includes a second inner lead.

6. A semiconductor package, comprising:
   a TCP (tape carrier package) tape carrier having a first face and a second face;
   a plurality of first inner leads provided on the first face of the tape carrier;
   a COF (chip-on-film) film carrier having a first face and a second face;
   at least one second inner lead provided on the first face of the film carrier;
   an insulation layer provided between the plurality of first inner leads and the at least one second inner lead; and
   a semiconductor chip connected to the first and second inner leads; and
   a plurality of first bumps and at least one second bump provided on the semiconductor chip,
   wherein the plurality of first inner leads are connected to the semiconductor chip via the plurality of first bumps and the at least one second inner lead is connected to the semiconductor chip via the at least one second bump, and
   wherein the first face of the tape carrier faces the first face of the film carrier, and the plurality of first inner leads cross the at least one second inner lead and are electrically insulated from the at least one second inner lead by the insulation layer.

7. The semiconductor package according to claim 6, wherein at least the first or second inner leads have recesses in positions of intersections with the other inner leads.

8. The semiconductor package according to claim 6, wherein a recess is formed in each said first inner lead in a position of intersection with the corresponding second inner lead, and the first and second inner leads intersect one another on a one-to-one basis.

9. The semiconductor package according to claim 8, wherein recesses are formed in the first inner leads in positions of intersections with the second inner lead, and one said second inner lead intersects more than one said first inner lead.

10. The semiconductor package according to claim 6, wherein each said first inner lead or each said second inner lead has an S-shaped or Z-shaped bent portion, and the bent portion of each said first or second inner lead intersects the other inner lead.

11. The semiconductor package according to claim 6, wherein a recess is formed in each said first inner lead in a position of intersection with the second inner lead, the second inner lead has an X-shaped portion, and the X-shaped portion faces the recesses in the first inner leads.

12. The semiconductor package according to claim 6, wherein recesses are formed in positions of intersections in both the first and second inner leads, and the recesses are disposed facing one another.

13. A TCP (tape carrier package) tape carrier that is used for the semiconductor package according to claim 6.

14. A COF (chip-on-film) film carrier that is used for the semiconductor package according to claim 6.

* * * * *